United States Patent
Eagen et al.

(10) Patent No.: US 9,880,026 B1
(45) Date of Patent: Jan. 30, 2018

(54) MAGNETIC FIELD SENSOR FOR DETECTING MOTION OF AN OBJECT

(71) Applicant: Allegro Microsystems, LLC, Worcester, MA (US)

(72) Inventors: Jeffrey Eagen, Manchester, NH (US); Paul A. David, Bow, NH (US); William P. Taylor, Amherst, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 15/210,211

(22) Filed: Jul. 14, 2016

(51) Int. Cl.
*G01R 33/09* (2006.01)
*G01B 7/30* (2006.01)
*G01D 5/165* (2006.01)

(52) U.S. Cl.
CPC .................................. *G01D 5/165* (2013.01)

(58) Field of Classification Search
CPC .................................. G01B 7/30; G01R 33/09
USPC ........................................ 324/207.25, 207.21
See application file for complete search history.

(56) References Cited

U.S. PATENT DOCUMENTS

| | | | | | |
|---|---|---|---|---|---|
| 5,471,736 | A | * | 12/1995 | Griebeler | 29/609 |
| 5,512,822 | A | * | 4/1996 | Masuda | 324/235 |
| 5,644,226 | A | | 7/1997 | Aoyama et al. | |
| 8,203,332 | B2 | * | 6/2012 | Guo et al. | 324/207.25 |
| 2003/0222642 | A1 | * | 12/2003 | Butzmann | 324/207.21 |
| 2004/0095129 | A1 | * | 5/2004 | Furlong | 324/207.2 |
| 2006/0103373 | A1 | * | 5/2006 | Ricks et al. | 324/207.21 |
| 2012/0249133 | A1 | | 10/2012 | Friedrich | |
| 2013/0298669 | A1 | | 11/2013 | Ausserlechner | |
| 2015/0022187 | A1 | | 1/2015 | Taylor et al. | |
| 2016/0123771 | A1 | | 5/2016 | David et al. | |
| 2016/0123774 | A1 | | 5/2016 | Foletto et al. | |

FOREIGN PATENT DOCUMENTS

JP 2006038658 2/2006

OTHER PUBLICATIONS

U.S. Appl. No. 15/176,665, filed Jun. 8, 2016, Vig, et al.
U.S. Appl. No. 15/176,645, filed Jun. 8, 2016, David, et al.
U.S. Appl. No. 15/176,668, filed Jun. 8, 2016, David, et al.
U.S. Appl. No. 15/176,655, filed Jun. 8, 2016, David, et al.
PCT Search Report and Written Opinion dated Sep. 15, 2017 for PCT Application No. PCT/US2017/038415; 16 pages.

* cited by examiner

*Primary Examiner* — Bot Ledynh
(74) *Attorney, Agent, or Firm* — Daly, Crowley, Mofford & Durkee, LLP

(57) ABSTRACT

A magnetic field sensor for detecting motion of an object includes a magnet configured to generate a magnetic field and having a first surface adjacent to the object and a second surface distal from the object. The first surface of the magnet has a centerline axis substantially parallel to and disposed on the first surface, and the centerline axis is diagonal with respect to a motion axis substantially parallel to and disposed on the first surface and parallel to which the object moves. The magnetic field sensor also includes a semiconductor substrate disposed between the magnet and the object, the semiconductor substrate supporting a plurality of spaced magnetoresistance elements disposed along a sensing element axis substantially parallel to the centerline axis of the magnet and configured to generate a respective plurality of magnetic field signals in response to the motion of the object with respect to magnetic field.

25 Claims, 9 Drawing Sheets

US 9,880,026 B1

MAGNETIC FIELD SENSOR FOR DETECTING MOTION OF AN OBJECT

CROSS REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors, and more particularly, to a magnetic field sensor for detecting motion of an object.

BACKGROUND

As is known, some motion (e.g., rotation) detectors include a magnetic field sensor to detect motion of an object, such as a gear or ring magnet. A magnetic field affected by movement of the object may be detected by one or more magnetic field sensing elements, such as Hall effect elements and/or magnetoresistance elements, which provide a signal (i.e., a magnetic field signal) proportional to a detected magnetic field. Such magnetic field signals can be processed to detect position, proximity, speed and/or direction of motion of the object.

SUMMARY

Described herein are concepts, systems, circuits and techniques related to a magnetic field sensor for detecting motion of an object with an improved response to a magnetic field and therefore improved sensing.

In one aspect of the concepts described herein, a magnetic field sensor for detecting motion of an object includes a magnet configured to generate a magnetic field and having a first surface adjacent to the object and a second surface distal from the object. The first surface of the magnet has a centerline axis substantially parallel to and disposed on the first surface and the centerline axis is substantially diagonal with respect to a motion axis substantially parallel to and disposed on the first surface. Features of the object pass parallel to the motion axis when the object is in motion. The magnetic field sensor also includes a semiconductor substrate disposed between the magnet and the object, the semiconductor substrate supporting a plurality of spaced magnetoresistance elements disposed along a sensing element axis substantially parallel to the centerline axis of the magnet and configured to generate a respective plurality of magnetic field signals in response to the motion of the object with respect to the magnetic field. A line substantially perpendicular to the first surface of the magnet intersects both the centerline axis and the sensing element axis.

The magnetic field sensor may include one or more of the following features individually or in combination with other features. The first surface of the magnet may form a square and the centerline axis may extend from a first vertex of the first surface of the magnet to an opposite vertex of the first surface of the magnet. The centerline axis may be approximately forty-five degrees from the motion axis. The first surface of the magnet may form a circle. The centerline axis may pass proximate to a center of the magnet (e.g., a substantially geometric center point on the first surface of the magnet). A center magnetoresistance element of the plurality of magnetoresistance elements may be disposed proximate to a center of the magnet. Each of the plurality of magnetoresistance elements may have a maximum response axis orthogonal to the centerline axis. The plurality of magnetoresistance elements may be substantially equidistantly spaced apart from each other along the sensing element axis. The plurality of magnetoresistance elements may be spaced along the sensing element axis at locations selected to maximize phase separation of the magnetic field signals.

The plurality of magnetoresistance elements may be coupled in a bridge configuration. The plurality of magnetoresistance elements may comprise one or more of an anisotropic magnetoresistance (AMR) element, a giant magnetoresistance (GMR) element, a magnetic tunnel junction (MTJ) element and a tunneling magnetoresistance (TMR) element. Each of the plurality of magnetoresistance elements may have a substantially similar resistance when the magnetic field has a magnetic field strength of about zero Gauss. The magnet may have a shape corresponding to one of a cube, a cylinder, a rectangular prism or a pyramid. The first surface of the magnet may correspond to a north pole of the magnet and the second surface of the magnet may correspond to a south pole of the magnet. The first surface of the magnet may correspond to a south pole of the magnet and the second surface of the magnet may correspond to a north pole of the magnet.

The magnetic field sensor may further comprise circuitry responsive to the plurality of magnetic field signals to provide an output signal of the magnetic field sensor indicative of the motion of the object. The output signal of the magnetic field sensor may be indicative of one or more of a speed of motion of the object and a direction of motion of the object. The plurality of magnetoresistance elements may comprise three pairs of magnetoresistance elements coupled in a bridge configuration to generate a first differential voltage signal corresponding to a difference between voltages across a first pair and a second pair of the magnetoresistance elements and to generate a second differential voltage signal corresponding to a difference between voltages across the second pair and a third pair of the magnetoresistance elements.

In another aspect of the concepts described herein, a magnetic field sensor for detecting motion of an object includes a magnet configured to generate a magnetic field and having a first surface adjacent to the object and a second surface distal from the object. The first surface of the magnet has a first centerline axis and a second centerline axis which are substantially parallel to and disposed on the first surface, and the first centerline axis and the second centerline axis are each substantially diagonal with respect to a motion axis substantially parallel to and disposed on the first surface. Features of the object pass parallel to the motion axis when the object is in motion and the first centerline axis is substantially perpendicular to the second centerline axis.

The magnetic field sensor also includes a semiconductor substrate disposed between the magnet and the object, the semiconductor substrate supporting a plurality of spaced magnetoresistance elements disposed along at least one of a first sensing element axis substantially parallel to the first centerline axis of the magnet and a second sensing element axis substantially parallel to the second centerline axis. The plurality of magnetoresistance elements is configured to generate a respective plurality of magnetic field signals in response to the motion of the object with respect to the magnetic field. A first line substantially perpendicular to the first surface of the magnet intersects both the first centerline axis and the first sensing element axis, and a second line substantially perpendicular to the first surface of the magnet intersects both the second centerline axis and the second sensing element axis. At least one of the plurality of magnetoresistance elements is disposed along the first sensing element axis and at least one of the plurality of magnetoresistance elements is disposed along the second sensing element axis.

The magnetic field sensor may include one or more of the following features individually or in combination with other features. The plurality of magnetoresistance elements may be substantially equidistantly spaced apart from each other along the first sensing element axis and the second sensing element axis. The first surface of the magnet may form a square and the first centerline axis may extend from a first vertex of the first surface of the magnet to a second vertex of the first surface of the magnet that is opposite to the first vertex. Additionally, the second centerline axis may extend from a third vertex of the first surface of the magnet to a fourth vertex of the first surface of the magnet that is opposite to the third vertex. The third vertex and the fourth vertex may be both different from the first vertex and the second vertex.

The first centerline axis and the second centerline axis may be approximately forty-five degrees from the motion axis. The magnetic field sensor may further include at least one magnetoresistance element disposed along a third sensing element axis that is approximately forty-five degrees from both the first sensing element axis and the second sensing element axis. The first surface of the magnet may form a circle. The plurality of magnetoresistance elements may include one or more of an anisotropic magnetoresistance (AMR) element, a giant magnetoresistance (GMR) element, a magnetic tunnel junction (MTJ) element and a tunneling magnetoresistance (TMR) element.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
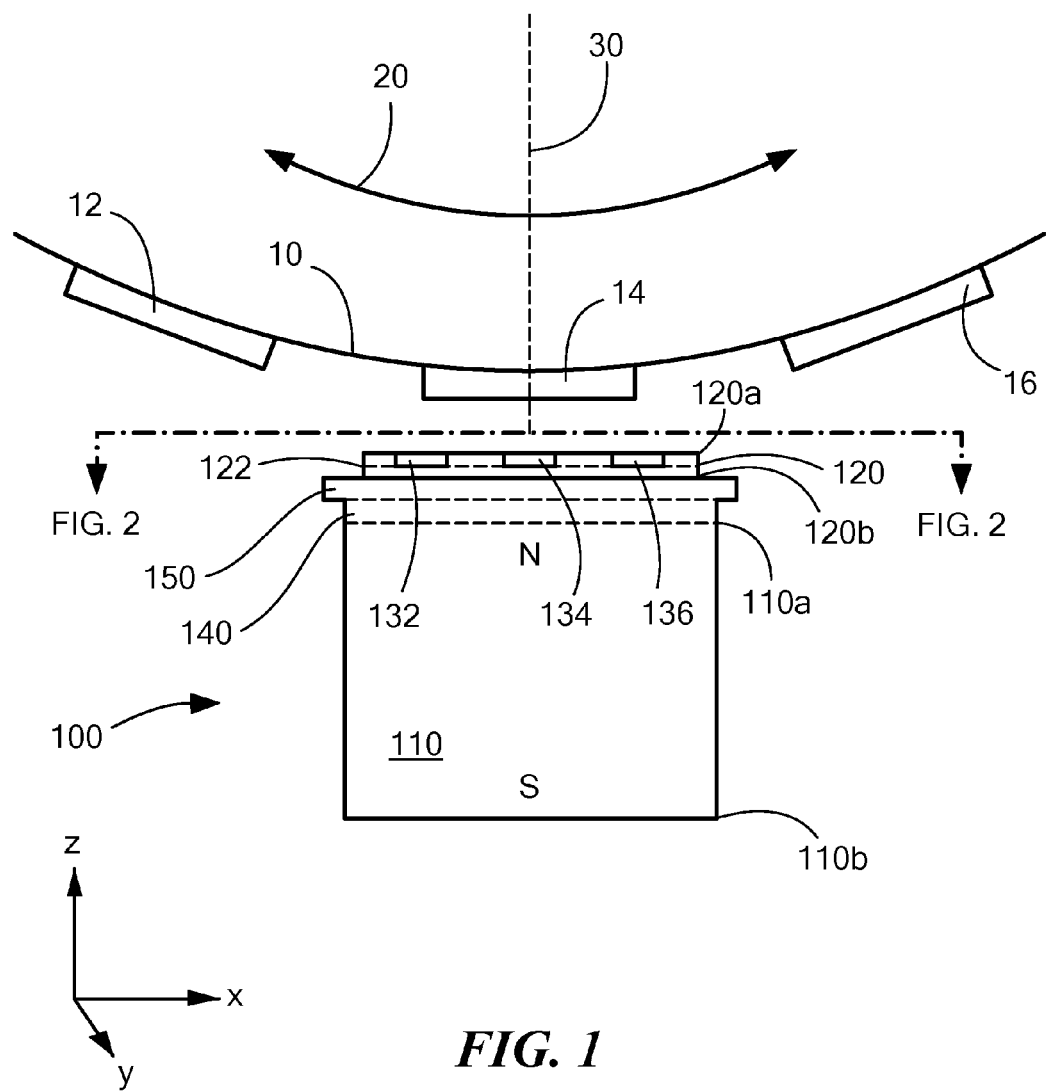
FIG. 1 shows an example magnetic field sensor for detecting motion of an object according to the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

For convenience, certain introductory concepts and terms used in the specification are collected here.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements may have a maximum response axis parallel to a substrate that supports the magnetic field sensing element, and others of the above-described magnetic field sensing elements tend to have a maximum response axis perpendicular to a substrate that supports the magnetic field sensing element. In particular, planar Hall elements tend to have a maximum response axis perpendicular to a substrate, while metal based or metallic magnetoresistance elements (e.g., GMR, TMR, AMR) and vertical Hall elements tend to have a maximum response axis parallel to a substrate.

As used herein, the term "magnetic field sensor" is used to describe a circuit that uses one or more magnetic field sensing elements, generally in combination with other components and/or circuits. Magnetic field sensors are used in a variety of applications, including, but not limited to, an angle sensor that senses an angle of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or features of a ferromagnetic target (e.g., gear teeth) where the magnetic field sensor is used in combination with a back-biased or other magnet, and a so-called linear magnetic field sensor that senses a magnetic field density of a magnetic field.

As used herein, the term "motion" is used to describe a variety of types of movement associated with an object, for example, including rotational movement (or "rotation") and linear (or "rectilinear") movement of the object. A "motion detector" may, for example, detect rotation of an object. A "rotation detector" is a particular type of "motion detector."

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit.

While examples below describe magnetic field sensors for detecting motion of specific objects (e.g., ferromagnetic gears), it should be appreciated that the magnetic field sensors disclosed herein may be found suitable for detecting motion of a variety of objects.

Additionally, while magnetic field sensors including a specific number of magnetoresistance elements (e.g., three magnetoresistance elements) are described in several examples below, such is discussed to promote simplicity, clarity and understanding in the description of the concepts, systems, circuits and techniques sought to be protected herein and is not intended to be, and should not be construed as, limiting. The magnetic field sensors disclosed herein may be implemented using more than or less than the specific number of magnetoresistance elements. It follows that the term "magnetic field sensing element" and the term "magnetoresistance element" can be used to describe more than one physical semiconductor structure (for example, more than one magnetoresistance element yoke) coupled together in such a way as to generate one or more magnetic field signals in response to a magnetic field. Thus, individual magnetoresistance elements shown in figures below can instead each be comprised of more than one magnetoresistance element.

Further, it should be appreciated that, as used herein, relational terms, such as "first," "second," "top," "bottom," "left," "right," and the like, may be used to distinguish one element or portion(s) of an element (e.g., a surface of an element) from another element or portion(s) of the element (e.g., an opposing surface of the element) without necessarily requiring or implying any physical or logical relationship or order between such elements.

Referring to FIG. 1, an example magnetic field sensor 100 which is capable of detecting motion of an object 10 (e.g., a ring magnet or ferromagnetic gear) is shown to include a magnet 110, a semiconductor substrate 120, and a plurality of magnetoresistance elements (here, magnetoresistance elements 132, 134, 136) supported by the substrate 120. The magnetic field sensor 100 is also shown to include a magnetic concentrator 140 as may comprise one or more soft magnetic materials and a lead frame 150, which are optional in some embodiments. The object 10 can have features (e.g., gear teeth 12, 14, 16) and be disposed on a shaft (e.g., a steering shaft) configured to rotate in one or more directions 20. However, the object 10 is but one type of object to which the magnetic field sensor 100 can be responsive and rotation is but one type of motion to which the sensor 100 can be responsive.

The magnet 110, which is configured to generate a magnetic field, has a first surface 110a adjacent to the object 10 and a second surface 110b distal from the object 10. The first surface 110a of the magnet 110 corresponds to a north magnetic pole N of the magnet 110, and the second surface 110b of the magnet 110 corresponds to a south magnetic pole S of the magnet 110 in the illustrated embodiment. However, in other embodiments, the first surface 110a of the magnet 100 may correspond to a south magnetic pole S of the magnet 110 and the second surface 110b of the magnet 100 may correspond to a north magnetic pole N of the magnet 110.

Figure 2:
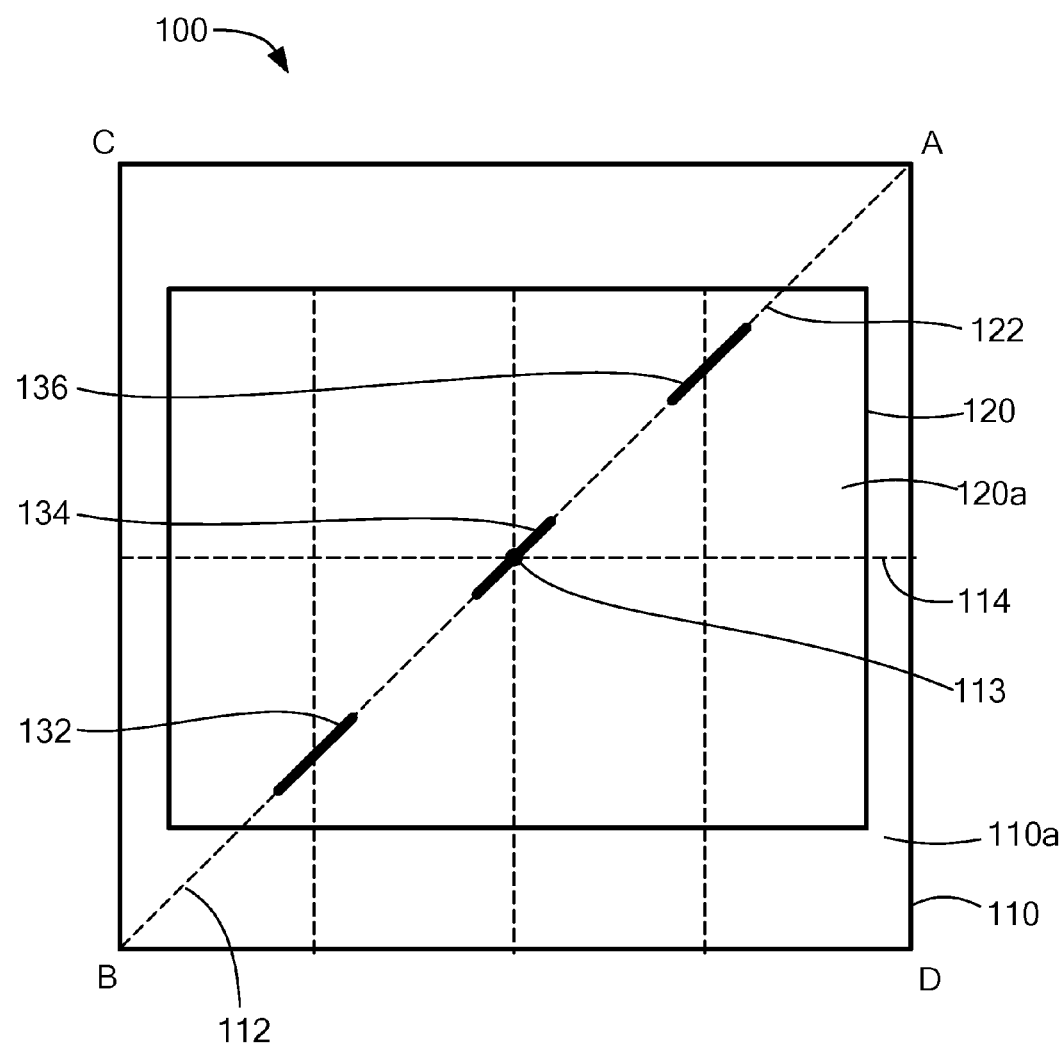
FIG. 2 is a plan view of an example configuration of the magnetic field sensor of FIG. 1.

Referring also to the plan view of the magnetic field sensor 100 shown in FIG. 2, the first surface 110a of the magnet 110 has a centerline axis 112 which is substantially parallel to and disposed on the first surface 110a. The centerline axis 112 passes substantially through a substantially geometric center point 113 on the first surface 110a. In some embodiments (e.g., embodiments in which the magnetic field sensor 100 does not include magnetic concentrator 140), a "center point" of a magnet may coincide with the point on a surface (e.g., first surface 110a) of a magnet (e.g., magnet 110) at which magnetic field strength in the direction of polarization is the greatest. In other embodiments (e.g., embodiments in which the magnetic field sensor 100 includes magnetic concentrator 140), the point (or points) on the surface of the magnet at which magnetic field strength in the direction of polarization is the greatest may be different from the substantially geometric center point (e.g., 113) on the surface (e.g., 110a) of the magnet (e.g., 110).

The first surface 110a of the magnet 110 also has a motion axis 114 which is substantially parallel to and disposed on the first surface 110a. Features of the object 10 (e.g., gear teeth 12, 14, 16) pass substantially parallel to the motion axis 114 when the object 10 is in motion. In other words, the motion axis 114 may be aligned with a direction of motion, e.g., 20, shown in FIG. 1, of the object 10.

The semiconductor substrate 120, which can be substantially any semiconductor substrate suitable for supporting electronic components and can comprise various layers including, but not limited to, diffusion layers, implant layers, metal layers, via and contact layers, etc., is disposed between the magnet 110 and the object 10. The substrate 120 has a first surface 120a adjacent to the object 10 and a second surface 120b distal from the object 10. In the illustrated embodiment, the first surface 120a of the substrate 120 supports the plurality of magnetoresistance elements (here, magnetoresistance elements 132, 134, 136). In other embodiments (e.g., so-called "flip-chip" embodiments), the second surface 120b of the substrate 120 may support the magnetoresistance elements 132, 134, 136 such that the magnetoresistance elements 132, 134, 136 are closer to the magnet 110 than shown in the illustrated embodiment. Each of the magnetoresistance elements 132, 134, 136 (e.g., GMR elements or yoke structures) is disposed along a sensing element axis 122 of the substrate 120 that is substantially parallel to the centerline axis 112 of the magnet 110 such that a line (e.g., line 30, shown in FIG. 1) which is substantially perpendicular to the first surface 110a of the magnet 110 intersects both the centerline axis 112 and the sensing element axis 122. Each of the magnetoresistance elements 132, 134, 136 may comprise one or more individual elements. For example, in an embodiment shown in FIG. 7, each such element corresponds to a respective pair of closely positioned elements.

In the illustrated view of FIG. 2, the centerline axis 112 and the sensing element axis 122 are each not parallel and not orthogonal with respect to the motion axis 114. In contrast, the relationship between the centerline axis 112 and the motion axis 114 and the relationship between the sensing element axis 122 and the motion axis 114, which relationships are angular relationships, may be referred to generally as "diagonal." In one embodiment, the centerline axis 112 is approximately forty-five degrees from the motion axis 114. In another embodiment, the centerline axis 112 is between approximately forty degrees and fifty degrees from the motion axis 114. It should be appreciated that other example arrangements of the centerline axis 112 with respect to the motion axis 114 may be possible without degrading performance of the magnetic field sensor 100. In other words, there is some tolerance to the angles existing between the centerline axis 112 and the motion axis 114.

In the illustrated embodiment, the first surface 110a of the magnet 110 forms a square, and the centerline axis 112 of the magnet 110 is diagonal (i.e., forms a substantially straight line extending between opposite corners). The illustrated centerline axis 112 extends from a first vertex A of the first surface 110a of the magnet 110 to an opposite vertex B of the first surface 110a of the magnet 110. In other embodiments, the first surface 110a of the magnet 110 may take the form of a variety of different shapes including, but not limited to, a rectangle, a circle, or a triangle. Additionally, in other embodiments the centerline axis 112 may extend from a third vertex C of the first surface 110a of the magnet 110 to a fourth vertex D of the first surface 110a of the magnet 110 that is opposite to the third vertex C, where the third vertex C and the fourth vertex D are both different from the first vertex A and the second vertex B. Each of the magnetoresistance elements 132, 134, 136 has a respective maximum response axis which is in the plane of the magnet surface 110a and substantially orthogonal to the centerline axis 112 of the magnet 110.

In the embodiments of FIGS. 1 and 2, the substrate 120 (i.e., the first surface 120a of the substrate 120) has a different shape than the substantially square first surface 110a of the magnet 110; namely in these embodiments, the substrate surface 120a is substantially rectangular, as shown.

In another embodiment the substrate surface 120a may have the same shape as the magnet surface 110a. Other shapes of the substrate surface 120a are possible, such as a square. Furthermore, the substrate surface 120a may be of a similar size or a different size with respect to the magnet surface 110a.

The magnetoresistance elements 132, 134, 136 generate respective magnetic field signals in response to motion of the object 10 with respect to a magnetic field generated by the magnet 110. Specifically, with such a back-biased magnet configuration, motion of the object 10 can result in variations of the magnetic field sensed by the magnetoresistance elements 132, 134, 136 and, thus, result in variations of the magnetic field signals.

In the embodiments of FIGS. 1 and 2, the magnetoresistance elements 132, 134, 136 are substantially equidistantly spaced apart from each other along the sensing element axis 122, with magnetoresistance element 134 located substantially equidistant between the magnetoresistance elements 132, 136. Additionally, a center magnetoresistance element (here, element 134) of the magnetoresistance elements 132, 134, 136 is disposed proximate to a center of the magnet 110 (e.g., substantially geometric center point 113 on the first surface 110a of the magnet 110) in the illustrated embodiment.

Generally, however, the magnetoresistance elements 132, 134, 136 may be spaced along the sensing element axis 122 at locations selected to optimize phase separation between the magnetic field signals generated by the magnetoresistance elements 132, 134, 136 without sacrificing signal strength as may be desirable when detecting motion (e.g., direction of motion) of the object 10. Further, generally the sensing element axis 122 may be arranged with respect to the motion axis 114 (e.g., not parallel and not orthogonal, as discussed above) to optimize phase separation between the resulting magnetic field signals. Optimal phase separation between the resulting magnetic field signals may, for example, be a maximum phase separation or at least a predetermined minimum phase separation to permit accurate phase detection. In some embodiments, the magnetoresistance elements 132, 134, 136 may also be spaced along the sensing element axis 122 at locations selected to change the magnetic bias on the magnetoresistance elements 132, 134, 136. Such may, for example, change the effective sensitivity and/or effective saturation point of the magnetoresistance elements 132, 134, 136.

The magnetoresistance elements 132, 134, 136 may include one or more of a giant magnetoresistance (GMR) element, a magnetic tunnel junction (MTJ) element and a tunneling magnetoresistance (TMR) element. The magnetoresistance elements 132, 134, 136 may also include an anisotropic magnetoresistance (AMR) element. In some embodiments, the magnetic field sensor 100 may also include one or more other types of magnetic field sensing elements (e.g., Hall effect elements) in addition to magnetoresistance elements 132, 134, 136. The other types of magnetic field sensing elements may also be supported by the semiconductor substrate 120 (i.e., a same semiconductor substrate) and configured to generate a magnetic field signal in response to the magnetic field generated by the magnet 110. For example, the magnetic field signals generated by the other types of sensing elements may be used to provide for more accurate signal detection. Hall effect elements may, for example, be used to determine common field interferences. In one embodiment, each of the magnetoresistance elements 132, 134, 136 has a substantially similar resistance and generates substantially similar magnetic field signals when subject to a magnetic field having a magnetic field strength of about zero Gauss.

As will be described further below, the magnetic field sensor 100 can also include circuitry (described below in connection with FIG. 9) responsive to the magnetic field signals generated by the magnetoresistance elements 132, 134, 136 to provide an output signal of the magnetic field sensor 100. In particular, the circuitry may include right channel circuitry (i.e., a first signal path) coupled to receive magnetic field signals from magnetoresistance element 132 and a center magnetoresistance element (here, magnetoresistance element 134), and left channel circuitry (i.e., a second signal path) coupled to receive magnetic field signals from magnetoresistance element 136 and center magnetoresistance element 134, with the right and left channel circuitry configured to generate right and left channel signals having edges indicative of motion of the object. In other words, in the illustrated embodiment, the magnetoresistance elements 132, 134, 136 may be used for differential magnetic field sensing, with center magnetoresistance element 134 used in both channels as a so-called reference magnetoresistance element. The designations "right" and "left" are arbitrary and indicate generally that two different signals are generated, each indicative of the magnetic field sensed at a different respective location relative to the object 10.

The above-described right and left channel signals may be used by the circuitry to generate the sensor output signal which may, for example, be indicative of one or both of a speed of motion of the object 10 and a direction of motion (e.g., rotation) of the object 10. In one embodiment, when the object 10 is not in motion, the output signal is indicative of whether the magnetoresistance elements 132, 134, 136 are over a feature (e.g., gear teeth 12, 14, 16) of the object 10. Additionally, in one embodiment, when the object 10 is in motion, the output signal may have an edge rate or frequency indicative of a speed of motion of the object 10. Edges or transitions of state of the output signal can be used to identify positions of features (e.g., edges of gear teeth 12, 14, 16) of the object 10 as they pass by the magnetoresistance elements 132, 134, 136. Thus, the magnetic field sensor 100 may be at least one of a so-called "edge detector" and a so-called "tooth detector" in some embodiments. As known, an "edge detector" is unable to identify whether magnetic field sensing elements are proximate to features (e.g., gear teeth 12, 14, 16) of an object (e.g., 10), particularly when the object is in motion, but is able to sense edges of the features as they move past the magnetic field sensing elements. As also known, a "tooth detector" is able to identify whether magnetoresistance elements are proximate to features of an object.

Figure 3:
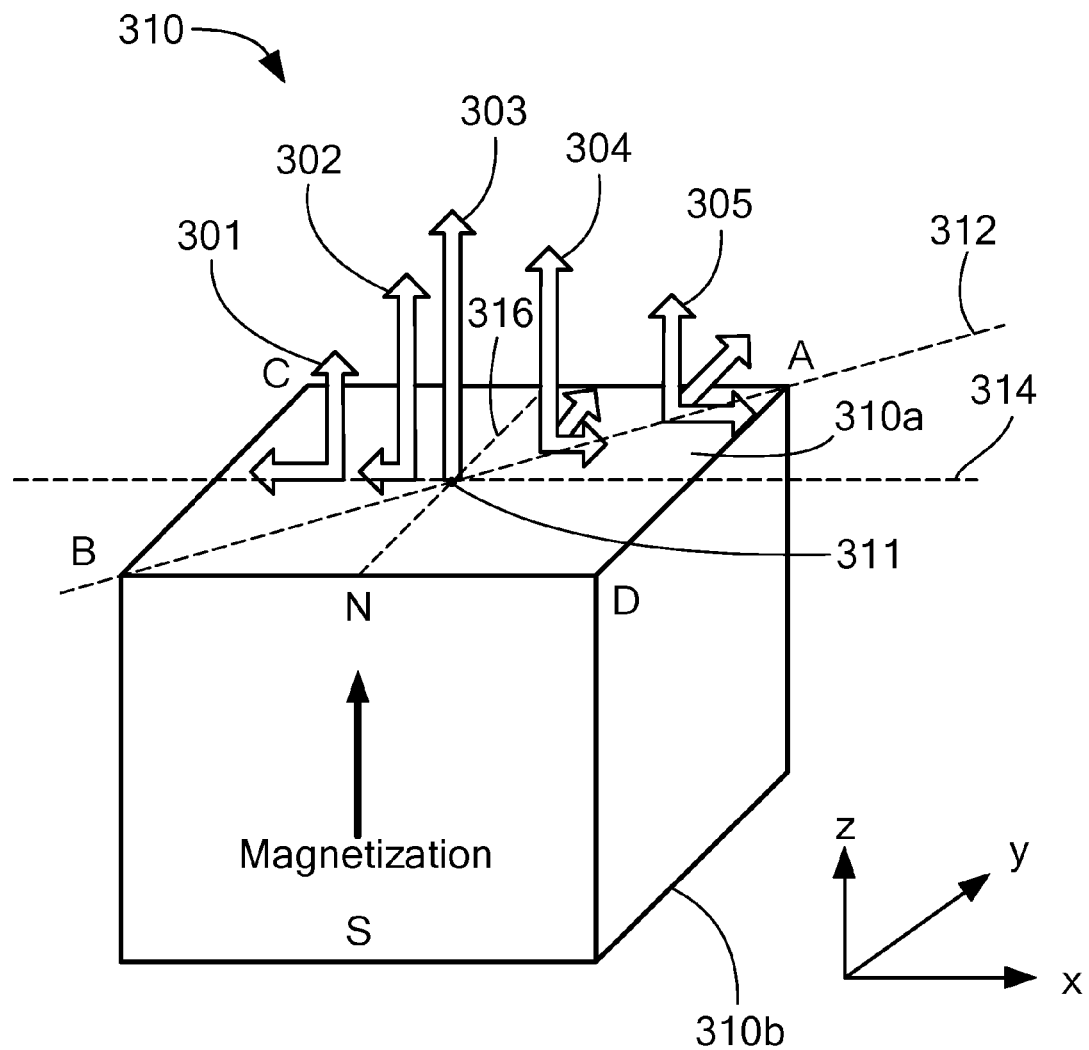
FIG. 3 shows an example magnet of the magnetic field sensor of FIGS. 1 and 2.

Referring to FIG. 3, an example magnet 310 that may be provided in the magnetic field sensor of FIGS. 1 and 2 is shown in order to illustrate example magnetic field components as a result of motion of an object (e.g., object 10, shown in FIG. 1) having features that move substantially parallel to a motion axis 314. Magnet 310, which may be the same as or similar to magnet 110 of FIGS. 1 and 2, for example, has a first surface 310a, a second surface 310b and a shape corresponding to a cube. The first surface 310a has a centerline axis 312 which is substantially parallel to and disposed on the first surface 310a. The motion axis 314 is substantially diagonal with respect to the centerline axis 312 and, similar to the centerline axis 312, is disposed on the first surface 310a. Further, the motion axis 314 and the centerline axis 312 intersect at a center (e.g., a substantially geometric center point 311) of the first surface 310a of the magnet 310 in the illustrated embodiment. A magnetic concentrator (e.g., 140, shown in FIG. 1) may be disposed between the first surface 310a of magnet 310 and a substrate (e.g., 120) of the magnetic field sensor (e.g., 100) including the magnet 310. As known, the magnetic profile of a magnet (e.g., 310) may change according to one or more properties (e.g., dimensions, materials, etc.) of a magnetic concentrator disposed proximate to the magnet. For simplicity of discussion in connection with FIG. 3, it will be assumed that a magnetic concentrator is not disposed proximate to magnet 310.

Magnitudes and directions of an example magnetic field generated by the magnet 310 as may be observed at various points on the first surface 310a of magnet 310, which field is generally directed orthogonal to the first surface 310a of the magnet 310, are indicated by arrows 301, 302, 303, 304 and 305 in the figure shown. As illustrated, the magnetic field may have a maximum magnetic field strength in a z-direction substantially coincident with the center point 311, as indicated by arrow 305. Additionally, as illustrated, the strength of the magnetic field may decrease in the z-direction when moving away from the substantially geometric center point 311 in substantially any direction (e.g., proximate to a side or vertex of the magnet 310), as indicated by arrows 301, 302, 304 and 305. Further, as illustrated, the strength of the magnetic field may increase in a y-direction and/or an x-direction when moving away from the center point 311 in substantially any direction. For example, the magnetic field may increase in the x-direction when moving away from center point 311 along the motion axis 314, as indicated by arrows 301, 302. The magnetic field may also increase in the y-direction when moving away from center point 311 along the centerline axis 312, as indicated by arrows 304, 305.

The foregoing may, for example, cause magnetoresistance elements (e.g., 132, 134, 136, shown in FIG. 2) disposed at various positions along a sensing element axis (e.g., 122, shown in FIG. 2) of a substrate (e.g., 120, shown in FIG. 2) to have selected responses to the magnetic field generated by the magnet 310. For example, if the sensing element axis of the substrate were arranged substantially parallel with respect to the motion axis 314 of the magnet 310 and the magnetoresistance elements were substantially aligned with both the sensing element axis and the motion axis 314, resulting magnetic field signals generated by the magnetoresistance elements (e.g., in response to motion of an object with respect to the magnetic field generated by the magnet 310) would have substantially no signal strength. Such may, for example, be due to there being substantially no magnetic field projection in the y-direction and each of the magnetoresistance elements having a respective maximum response axis which is substantially orthogonal to the centerline axis 312 of the magnet 310, coinciding with the y-direction projection of the magnetic field (or lack thereof).

Additionally, if the sensing element axis of the substrate were arranged substantially orthogonal with respect to the motion axis 314 of the magnet 310, as indicated by an axis 316, and the magnetoresistance elements were substantially aligned with both the axis 316, there would be substantially no phase separation between resulting magnetic field signals generated by the magnetoresistance elements as an object (e.g., 10, shown in FIG. 1) passes along the motion axis 314. It follows that a magnetic field sensor (e.g., 100, shown in FIGS. 1 and 2) including these magnetoresistance elements would be unable to detect a direction of motion of an object. As known, direction of motion of an object is typically determined from a relative phase or relative time difference of magnetic field signals.

It is for the above reasons that magnetic field sensors according to the disclosure (e.g., 100, shown in FIGS. 1 and 2) have a magnet (e.g., 110) with a centerline axis (e.g., 112) that is substantially diagonal with respect to a motion axis (e.g., 114) and a substrate (e.g., 120) with a sensing element axis (e.g., 122) that is substantially diagonal with respect to the motion axis (e.g., to provide for magnetic field signals having both phase separation and signal strength). Additionally, it is for the above reasons that magnetoresistance elements according to the disclosure (e.g., 132, 134, 136, shown in FIGS. 1 and 2) are generally spaced along a sensing element axis at locations selected to optimize phase separation between magnetic field signals generated by the magnetoresistance elements without sacrificing signal strength as may be desirable when detecting direction of motion of an object. Further, it is for the above reasons that the sensing element axis may be arranged diagonally with respect to the motion axis 314 (e.g., not parallel and not orthogonal) to optimize phase separation between the resulting magnetic field signals.

Figure 4:
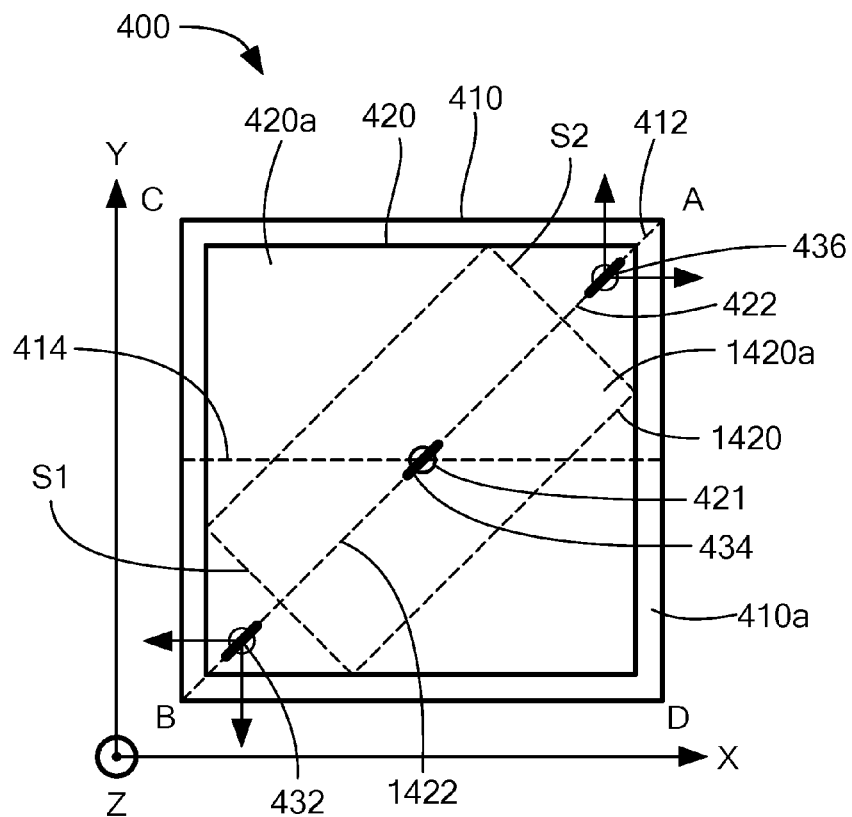
FIG. 4 is a plan view of a first example configuration of a magnetic field sensor including a plurality of magnetoresistance elements.
Figure 5:
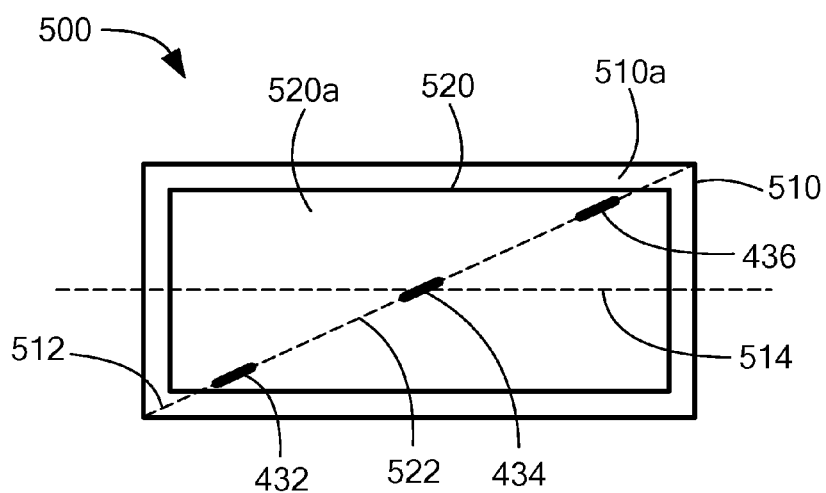
FIG. 5 is a plan view of a second example configuration of a magnetic field sensor including a plurality of magnetoresistance elements.
Figure 6:
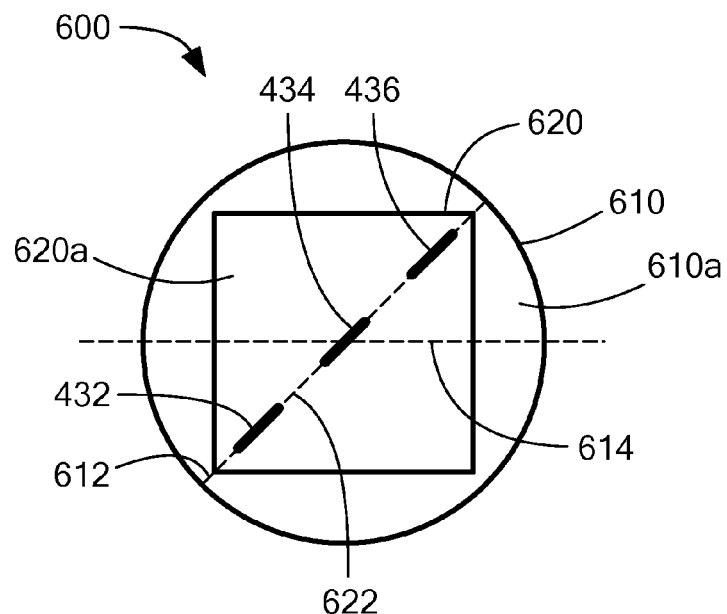
FIG. 6 is a plan view of a third example configuration of a magnetic field sensor including a plurality of magnetoresistance elements.

Referring to FIGS. 4-6, example configurations of magnetic field sensors according to the disclosure are shown. In some embodiments, the magnets and the substrates of the magnetic field sensors described below may comprise complementary surfaces (e.g., first surfaces 110a, 120a) having same or similar shapes (e.g., a square, rectangle or circular shape). In other embodiments, the magnets and the substrates may comprise complimentary surfaces having substantially different shapes (e.g., the substantially square shape magnet 110 and the substantially rectangular substrate 120 shown in FIG. 2). For simplicity of discussion in connection with FIGS. 4-6, the former (i.e., a same or similar shape) is shown.

Referring to FIG. 4, an example magnetic field sensor 400 includes a magnet 410 and a substrate 420 supporting a plurality of magnetoresistance elements 432, 434, 436 (e.g., GMR elements). The magnet 410, which is configured to generate a magnetic field and may be the same as or similar to magnet 310 of FIG. 3, for example, has a first surface 410a adjacent to the object (not shown) and a second surface (not shown) distal from the object. Additionally, the first surface 410a of the magnet 410 has a centerline axis 412 which is substantially parallel to and disposed on the first surface 410a. The first surface 410a also has a motion axis 414 which is substantially parallel to and disposed on the first surface 410a and substantially diagonal with respect to the centerline axis 412. Features of an object (e.g., gear teeth 12, 14, 16, shown in FIG. 1) to be sensed by magnetic field sensor 400 pass substantially parallel to the motion axis 414 when the object is in motion.

The substrate 420 is disposed between the magnet 410 and the object and has a first surface 420a adjacent to the object and a second surface (not shown) distal from the object. The substrate 420 supports each of the magnetoresistance elements 432, 434, 436, with each of the elements 432, 434, 436 disposed along a sensing element axis 422 disposed on first surface 420a of the substrate 420 in FIG. 4. In other embodiments (e.g., flip-chip embodiments), each of the elements 432, 434, 436 may be disposed along a sensing element axis disposed on the second surface of the substrate 420, with the second surface of the substrate 420 being more proximate to the first surface 410a of magnet 410 than the first surface 420a of the substrate 420 is to magnet 410. In the illustrated view, the sensing element axis 422 is substantially parallel to the centerline axis 412 of the magnet 410 such that a line substantially perpendicular to the first surface 410a of the magnet 410 intersects both the centerline axis 412 and the sensing element axis 422.

The magnet 410 and the substrate 420 each have a first surface (e.g., 410a and 420a) taking the form of a square, and the centerline axis 412 and the sensing element axis 422 each pass substantially proximate to a center (e.g., a substantially geometric center point) of a corresponding surface (e.g., a first surface) of the magnet 410 and the substrate 420, respectively. The illustrated centerline axis 412 extends from a first vertex A of the first surface 410a of the magnet 410 to an opposite vertex B of the first surface 410a of the magnet 410. In other embodiments, the illustrated centerline axis 412 may extend from a third vertex C of the first surface 410a of the magnet 410 to a fourth vertex D of the first surface 1010a of the magnet 410 that is opposite to the third vertex C, where the third vertex C and the fourth vertex D are both different from the first vertex A and the second vertex B. Magnetoresistance elements 432, 434, 436 each have a maximum response axis in the plane of the substrate surface 420a and substantially orthogonal to the centerline axis 412.

In one embodiment, the centerline axis 412 is approximately forty-five degrees from the motion axis 414 at which features of the object pass when the object is in motion. In another embodiment, both centerline axis 412 is between approximately forty degrees and fifty degrees from the motion axis 414. It should be appreciated that other example arrangements of the centerline axis 412 with respect to the motion axis 414 may be possible without degrading performance of the magnetic field sensor 400.

The magnetoresistance elements 432, 434, 436, which may be the same as or similar to the magnetoresistance elements 132, 134, 136 of FIGS. 1 and 2, for example, are spaced along the sensing element axis 422 and are configured to generate a respective plurality of magnetic field signals in response to motion of the object with respect to a magnetic field generated by the magnet 410. Specifically, motion of the object can result in variations of the magnetic field sensed by the magnetoresistance elements 432, 434, 436 and, thus, result in variations of the magnetic field signals generated by the magnetoresistance elements 432, 434, 436.

In the illustrated embodiment, the magnetoresistance elements 432, 434, 436 are substantially equidistantly spaced apart from each other along the sensing element axis 422, with magnetoresistance element 434 located substantially equidistant between the magnetoresistance elements 432, 436. In particular, magnetoresistance element 432 is disposed on the sensing element axis 422 at a location proximate to vertex B of the magnet 410, and magnetoresistance element 436 is disposed on the sensing element axis 422 at a location proximate to vertex A of the magnet 410. Additionally, magnetoresistance element 434 is disposed on the sensing element axis 422 at a location proximate to both a substantially geometric center point 421 on the first surface 420a of the substrate 420 and a substantially geometric center point of the magnet 410 (i.e., the point on the first surface 410a of the magnet 410 at which magnetic field strength in the Z-direction of polarization is the greatest).

In another example configuration in which the centerline axis 412 extends from vertex C of the magnet 410 to vertex D of the magnet 410, magnetoresistance element 432 may be disposed on a sensing element axis extending from vertex C to vertex D of the magnet 410. Additionally, magnetoresistance element 434 may be disposed on the sensing element axis 422 at a location proximate to the center point of the magnet 410. It should be appreciated that other configurations are possible. For example, magnetoresistance elements 432, 434, 436 may be disposed on two or more sensing element axes at various locations (as described below in connection with FIGS. 10-13).

Depending on a location of the magnetoresistance elements 432, 434, 436 on the sensing element axis 422 and a location of the sensing element axis 422 with respect to the motion axis 414, the magnetoresistance elements 432, 434, 436 may have selected responses to the magnetic field generated by the magnet 410 (i.e., experience different changes in resistance due to motion of the object with respect to the magnetic field). Thus, the magnetic field signals generated by the magnetoresistance elements 432, 434, 436 may also vary accordingly. For example, in the illustrated embodiment the magnetoresistance elements 432, 434, 436 are spaced along the sensing element axis 422 so as to generate magnetic field signals having both accurately detectable phase difference and signal strength in response to motion of the object parallel to the motion axis 414. As known, relative phases of magnetic field signals may be used to determine a direction of motion of an object. Additionally, edge transitions of magnetic field signals may be used to determine a speed of motion of an object.

Additionally, in the illustrated embodiment, magnetoresistance elements 432, 436 are each disposed along the sensing element axis 422 on opposite sides of the center element 434. In one embodiment, the magnetoresistance elements 432, 434, 436 are collectively capable of generating magnetic field signals having both an accurately detectable phase difference and signal strength (e.g., due to the alignment of the elements 432, 434, 434 along the sensing element axis 422 which sensing element axis is arranged with respect to the centerline axis 412 of the magnet 410 and the motion axis 414 in the above-described manner), as is desirable for detecting motion of an object.

Generally, the magnetoresistance elements 432, 434, 436 may be spaced along the sensing element axis 422 at locations selected to optimize phase separation between the magnetic field signals generated by the magnetoresistance elements 432, 434, 436 without sacrificing signal strength as may be desirable when detecting motion of the object. Additionally, generally the sensing element axis 422 may be arranged with respect to the motion axis 414 (e.g., not parallel and not orthogonal) to optimize phase separation between the resulting magnetic field signals. Further, in some embodiments, the magnetoresistance elements 432, 434, 436 may also be spaced along the sensing element axis 422 at locations selected to reduce (or ideally prevent) their susceptibility to becoming saturated.

With the above-described arrangement, the magnetic field sensor 400 is capable of detecting motion of an object. In particular, magnetoresistance elements 432, 434, 436 in the magnetic field sensor 400 each generate respective magnetic field signals in response to motion of the object with respect to a magnetic field generated by the magnet 410 and the magnetic field signals may be used to detect motion of the object.

While the substrate 420 of magnetic field sensor 400 is shown having a first surface 420*a* taking the form of a square in the illustrated embodiment, it should be appreciated that the substrate and the first surface of the substrate of magnetic field sensor 400 may take the form of a variety of different shapes. For example, the substrate may take the form of a substrate 1420 having a first surface 1420*a* taking the form of a rectangle, and each of the magnetoresistance elements 432, 434, 436 may be disposed along a sensing element axis 1422 of the substrate 1420. The sensing element axis 1422 may extend from a first side S1 of the substrate 1420 to a second opposite side S2 of the substrate 1420. Similar to sensing element axis 422 of substrate 420, the sensing element axis 1422 of substrate 1420 may be substantially parallel to the centerline axis 412 of the magnet 410 such that a line substantially perpendicular to the first surface 410*a* of the magnet 410 intersects both the centerline axis 412 and the sensing element axis 1422. Other shapes of the substrate and the first surface of the substrate are possible, as will be described below.

Referring to FIG. 5, another example magnetic field sensor 500 includes a magnet 510 and a substrate 520 supporting magnetoresistance elements 432, 434, 436. The substrate 520 is disposed between the magnet 510 and an object to be sensed (e.g., 10, shown in FIG. 1). Similar to magnet 400 of FIG. 4, magnet 510 has a first surface 510*a* adjacent to the object (not shown) and a second surface (not shown) distal from the object. Additionally, the first surface 510*a* of the magnet 510 has a centerline axis 512 which is substantially parallel to and disposed on the first surface 510*a*. The first surface 510*a* also has a motion axis 514 which is substantially parallel to and disposed on the first surface 510*a* and substantially diagonal with respect to the centerline axis 512.

Additionally, similar to substrate 420 of FIG. 4, substrate 520 has a sensing element axis 522 that is substantially parallel to the centerline axis 512 of the magnet 510 such that a line substantially perpendicular to the first surface 510*a* of the magnet 510 intersects both the centerline axis 512 and the sensing element axis 522. Further, similar to magnetoresistance elements 432, 434, 436 of FIG. 4, magnetoresistance elements 432, 434, 436 of FIG. 5 are substantially equidistantly spaced along the sensing element axis 522 and are configured to generate a respective plurality of magnetic field signals in response to motion of the object with respect to a magnetic field generated by the magnet 510.

Here, however, unlike the embodiment shown in FIG. 4, the magnet 510 and the substrate 520 shown in FIG. 5 each have a first surface (e.g., 510*a*, 520*a*) taking the form of a rectangle. As described in figures above, the magnet and the substrate 520 may have surfaces forming a wide variety of shapes.

In one embodiment, despite the first surfaces of the magnet 510 and the substrate 520 of magnetic field sensor 500 having a different shape than the magnet 410 and the substrate 420 of magnetic field sensor 400, the magnetoresistance elements 432, 434, 436 of magnetic field sensor 500 may have a same or similar response characteristic (e.g., selected responses to the magnetic field generated by the magnet 510) as the magnetoresistance elements 432, 434, 436 of the magnetic field sensor 400. In particular, similar to magnetoresistance elements 432, 434, 436 of the magnetic field sensor 400, the magnetoresistance elements 432, 434, 436 are spaced along the sensing element axis 522 of magnetic field sensor 500 so as to generate magnetic field signals having both accurately detectable phase difference and signal strength in response to motion of the object parallel to the motion axis 514. It follows that generally the locations at which the magnetoresistance elements 432, 434, 436 are disposed on the sensing element axis (e.g., 522) and the location of the sensing element axis with respect to the centerline axis (e.g., 512) and the motion axis (e.g., 514), and not the shape of the magnet (e.g., 510) and substrate (e.g., 520), largely affect the response characteristics of the magnetoresistance elements 432, 434, 436.

Referring to FIG. 6, another example magnetic field sensor 600 includes a magnet 610 and a semiconductor substrate 620 supporting magnetoresistance elements 432, 434, 436. The substrate 620 is disposed between the magnet 610 and an object to be sensed (e.g., 10, shown in FIG. 1). Similar to magnet 500 of FIG. 5, magnet 610 has a first surface 610a adjacent to the object (not shown) and a second surface (not shown) distal from the object. Additionally, the first surface 610a of the magnet 610 has a centerline axis 612 which is substantially parallel to and disposed on the first surface 610a. The first surface 610a also has a motion axis 614 which is substantially parallel to and disposed on the first surface 610a and substantially diagonal with respect to the centerline axis 612.

Additionally, similar to substrate 520 of FIG. 5, substrate 620 has a sensing element axis 622 that is substantially parallel to the centerline axis 612 of the magnet 610 such that a line substantially perpendicular to the first surface 610a of the magnet 610 intersects both the centerline axis 612 and the sensing element axis 622. Further, similar to magnetoresistance elements 432, 434, 436 of FIG. 5, magnetoresistance elements 432, 434, 436 of FIG. 5 are spacing along the sensing element axis 622 and are configured to generate a respective plurality of magnetic field signals in response to motion of the object with respect to a magnetic field generated by the magnet 610.

Here, however, unlike the embodiment shown in FIG. 5, the magnet 610 shown in FIG. 6 has a first surface 610a taking the form of a circle and the substrate 620 has a first surface 620a taking the form of a square. In one embodiment, despite the foregoing, the magnetoresistance elements 432, 434, 436 of magnetic field sensor 600 have a same or similar response characteristic as the magnetoresistance elements 432, 434, 436 of the magnetic field sensor 500, with the magnetic field signals generated by magnetoresistance elements 432, 434, 436 having both accurately detectable phase difference and signal strength. This may be based, at least in part, on the magnetoresistance elements 432, 434, 436 being located at same or similar locations on sensing element axis 622 as the magnetoresistance elements 432, 434, 436 are on sensing element axis 522. Additionally, this may be based, at least in part, on sensing element axis 622 of FIG. 6 being located in a same or similar manner with respect to centerline axis 612 and motion axis 614 as sensing element axis 522 of FIG. 5 is located with respect to centerline axis 512 and motion axis 514.

While the magnets and substrates (e.g., 610, 620) of the magnetic field sensors of FIGS. 4-6 are each shown as having a specific shape (e.g., a square and a rectangle) and including a plurality of magnetoresistance elements with the magnetoresistance elements positioned in a particular manner, it should be appreciated these magnetic field sensors illustrate but several of many potential configurations of magnetic field sensors according to the disclosure. Magnetic field sensors according to the disclosure may, for example, include magnets and/or substrates having different shapes from those shown and/or different shapes from each other. For example, while substrate 620 and the first surface 620a of substrate 620 each take the form of a square in FIG. 6, in some embodiments the substrate 620 and the first surface 620a of the substrate may take the form of any number of shapes, including an octagon and a circle. An octagon and/or a circle shaped substrate (or other irregular shaped substrate) may, for example, be achieved by laser cutting of a substrate. It should also be appreciated that magnetic field sensors according to the disclosure may have more than or fewer than the number of magnetoresistance elements (e.g., three) shown in the figures.

Figure 7:
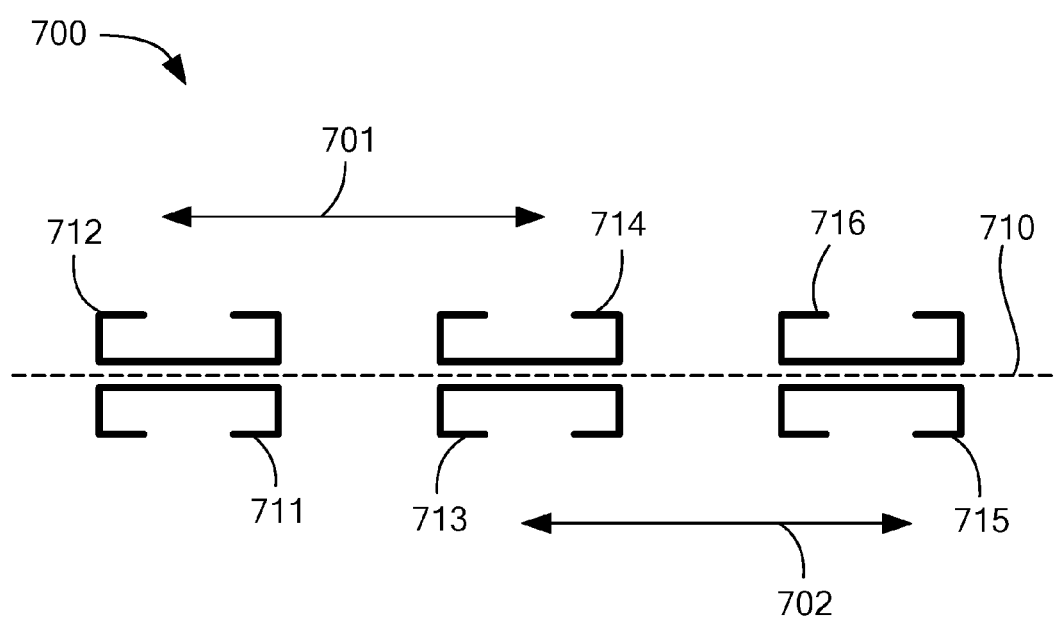
FIG. 7 shows an example plurality of magnetoresistance elements as may be provided in a magnetic field sensor according to the disclosure.

Referring to FIG. 7, an example plurality of magnetoresistance elements (here, magnetoresistance elements 711, 712, 713, 714, 715, 716) as may be provided in a magnetic field sensor according to the disclosure (e.g., 100, shown in FIG. 1) are shown coupled and spaced in an example configuration. The magnetoresistance elements 711, 712, 713, 714, 715, 716, each of which may be the same as or similar to the magnetoresistance elements described above in conjunction with FIGS. 1-2, are shown to be in the form of so-called "yokes" having a C-shape (or a reverse C-shape) in the illustrated embodiment. However, it should be appreciated that the magnetoresistance elements 711, 712, 713, 714, 715, 716 may take any form suitable for detecting motion of an object (e.g., 10, shown in FIG. 1) by sensing a magnetic field affected by such motion.

The magnetoresistance elements 711, 712, 713, 714, 715, 716 (e.g., GMR elements) are supported by a semiconductor substrate (not shown) and disposed along a sensing element axis 710 on a surface (e.g., a first surface) of the substrate. The substrate, which may be the same as or similar to substrate 120 of FIG. 1, for example, is disposed between a magnet (e.g., 110, shown in FIG. 1) and an object (e.g., 10, shown in FIG. 1) to be sensed. The magnet can have a first surface adjacent to the object and a second surface distal from the object. Additionally, the first surface of the magnet can have a centerline axis which is substantially parallel to and disposed on the first surface of the magnet such that a line substantially perpendicular to the first surface of the magnet intersects both the centerline axis of the magnet and the sensing element axis 710 of the substrate. The centerline axis and the sensing element axis 710 can each be substantially diagonal with respect to a motion axis substantially parallel to which features of the object pass when the object is in motion.

The magnetoresistance elements 711, 712, 713, 714, 715, 716 are coupled in pairs in the illustrated embodiment (e.g., as may be suitable for differential sensing arrangements). In particular, magnetoresistance elements 711, 712 are disposed proximate to each other to form a first magnetoresistance element pair, magnetoresistance elements 713, 714 are disposed proximate to each other to form a second magnetoresistance element pair, and magnetoresistance elements 715, 716 are disposed proximate to each other to form a third magnetoresistance element pair. The first element pair is spaced apart from the second element pair by a first distance 701, and the second element pair is spaced apart from the third element pair by a second distance 702. The first distance 701 and the second distance 702 may be the same as or similar to each other in some embodiments, and different from each other in other embodiments.

In one embodiment, the first distance 701 and the second distance 702 are selected to be substantially the same as each other such that the first element pair and the second element pair, and the second element pair and the third element pair, are substantially equidistantly spaced apart from each other along the sensing element axis 710. The first distance 701 and the second distance 702 may also be selected to be substantially the same as or different from each other based, at least in part, on a dimension (e.g., a width) of a feature (e.g., gear tooth 12, shown in FIG. 1) of the object to be sensed by the magnetoresistance elements. For example, the first distance 701 and the second distance 702 may be selected such that a spacing between the first element pair and the second element pair, and the second element pair and the third element pair, is substantially equal to a width of an object feature or a portion of a width (e.g., one half of a width) of an object feature.

Figure 8:
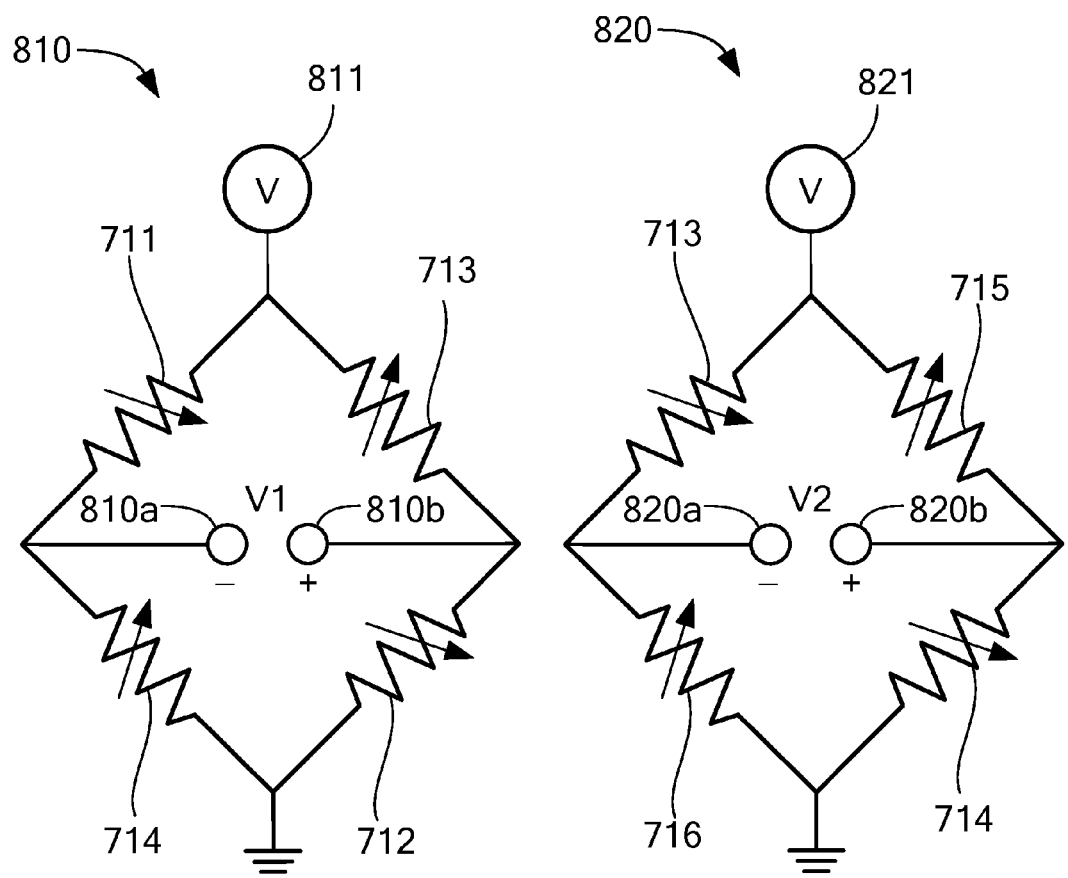
FIG. 8 shows an example arrangement of the plurality of magnetoresistance elements of FIG. 7.

The first distance 701 and the second distance 702 may further be selected such that the first element pair, the second element pair, and the third element pair are spaced along the sensing element axis 710 at locations selected to optimize phase separation of magnetic field signals generated by the magnetoresistance elements 711, 712, 713, 714, 715, 716. For example, in an arrangement in which the first element pair and the second element pair are coupled in a first bridge configuration (e.g., 810, shown in FIG. 8, as will be discussed), and the second element pair and the third element pair are coupled in a second bridge configuration (e.g., 820, shown in FIG. 8, as will be discussed), the magnetoresistance elements 711, 712, 713, 714, 715, 716 may be spaced along the sensing element axis 710 at locations selected to maximize phase separation of magnetic field signals generated by the magnetoresistance elements in the bridge configurations (e.g., signal V1 and signal V2, as shown in FIG. 8, as will be discussed).

The magnetoresistance elements 711, 712, 713, 714, 715, 716 each have a maximum response axis which is substantially parallel to and along the sensing element axis 710 and in a same direction. In other words, the magnetoresistance elements 711, 712, 713, 714, 715, 716 each have a maximum response axis which is substantially parallel to and diagonal with respect to the motion axis substantially parallel to which features of the object pass when the object is in motion. The magnetoresistance elements 711, 712, 713, 714, 715, 716 may also be responsive to magnetic fields at other angles in the plane of the substrate (and also out of the plane of the substrate). The degree to which the magnetoresistance elements are responsive to magnetic field at other angles not parallel to the sensing element axis 710 is determined, for example, based on a magnitude of a projection of the magnetic field at other angles onto the sensing element axis 710. The magnetoresistance elements 711, 712, 713, 714, 715, 716 may also have a temperature coefficient that is substantially the same to ensure that the magnetoresistance elements respond in a same or similar manner to changes in temperature and magnetic field strength.

In operation, the magnetoresistance elements 711, 712, 713, 714, 715, 716 are responsive to motion of the object with respect to a magnetic field as may be generated by a proximate magnet to generate a plurality of magnetic field signals. FIG. 8, for example, shows an example arrangement of the magnetoresistance elements 711, 712, 713, 714, 715, 716 in which the first element pair and the second element pair generate a first differential signal (e.g., signal V1, as will be discussed), and the second element pair and the third element pair generate a second differential signal (e.g., signal V2, as will be discussed).

It should be appreciated that while the magnetoresistance elements 711, 712, 713, 714, 715, 716 are shown coupled in pairs in the example arrangement shown in FIG. 7, the magnetoresistance elements be coupled in substantially any arrangement suitable for detecting motion of an object.

Referring to FIG. 8, in which like elements of FIG. 7 are shown having like reference designations, an example arrangement of the three magnetoresistance element pairs of FIG. 7 is shown. In particular, first and second element pairs (i.e., magnetoresistance elements 711, 712, 713, 714) are coupled in a first bridge configuration 810, and second and third element pairs (i.e., magnetoresistance elements 713, 714, 715, 716) are coupled in a second bridge configuration 820 in the illustrated embodiment. The bridge 810 is coupled to a voltage source 811 and each of magnetoresistance elements 711, 712, 713, 714 of bridge 810 may be driven by voltage source 811 in FIG. 8. Additionally, the bridge 820 is coupled to a voltage source 821 and each of magnetoresistance elements 713, 714, 715, 716 of bridge 820 may be driven by voltage source 821 in FIG. 8. In other embodiments, at least one of voltage source 811 and voltage source 821 may be provided as a current source, and the bridge(s) coupled to the current source(s) may be driven by the respective current source(s).

In bridge 810 of FIG. 8, a first output voltage is generated at first voltage node 810a and a second output voltage is generated at a second voltage node 810b to form a first differential signal V1 (i.e., a magnetic field signal V1). The first differential signal V1 may correspond to a difference between voltages at the first element pair (i.e., magnetoresistance elements 711, 712) and the second element pair (i.e., magnetoresistance elements 713, 714).

Similarly, in bridge 820 of FIG. 8, a first output voltage is generated at first voltage node 820a of the bridge 820 and a second output voltage is generated at a second voltage node 820b of the bridge 820 to form a second differential signal V2 (i.e., a magnetic field signal V2). The second differential signal V2 may correspond to a difference between voltages at the second element pair (i.e., magnetoresistance elements 713, 714) and the third element pair (here, magnetoresistance elements 715, 716). Example polarities of the first and second differential signals V1, V2 are indicated with plus and minus signs. It should be appreciated that the first and second differential signals V1, V2 may have different polarities than those shown depending on the arrangement of the first, second, and third element pairs.

As the resistance of the magnetoresistance elements in bridges 810 and 820 changes in response to motion of an object (e.g., 10, shown in FIG. 1) with respect to a magnetic field as may be generated by a magnet (e.g., 110, shown in FIG. 1), for example, at least one of the first output voltage generated at the first voltage node 810a and the second output voltage generated at the second voltage node 810b of bridge 810, and/or at least one of the first output voltage generated at the first voltage node 820a and the second output voltage generated at the second voltage node 820b of bridge 820, may also change. It follows that signal V1 of bridge 810 and signal V2 of bridge 820 may also change. Changes in signal V1 and/or signal V2 may, for example, be used to detect motion (e.g., speed of motion and/or direction of motion) of the object.

Processing of magnetic field signals such as signal V1 and signal V2 is described more fully below in conjunction with FIG. 9. However, let it suffice here to say that, with the example arrangement of FIG. 8, a sum of signal V1 and signal V2 (i.e., V1+V2) can have a maximum (positive or negative) instantaneous value when an object feature (e.g., gear tooth 12, as shown in FIG. 1) is centered about (i.e., between) one or more of the magnetoresistance elements 711, 712, 713, 714, 715, 716. The sum of signal V1 and signal V2 can, therefore, provide a so-called "feature signal" as may be suitable for a "tooth detector," such as that described above in conjunction with FIG. 1. In contrast, a difference of signal V1 and signal V2 (i.e., V1−V2) can have a maximum (positive or negative) instantaneous value when an edge of an object feature is centered about (i.e., between) one or more of the magnetoresistance elements 711, 712, 713, 714, 715, 716. The difference of signal V1 and signal V2 can, therefore, provide a so-called "edge signal" as may be suitable for an "edge detector," such as that described above in conjunction with FIG. 1.

It follows that a magnetic field sensor including the two bridge configurations 810, 820 and using both the sum of signal V1 and signal V2 and the difference of signal V1 and signal V2 can operate both as a tooth detector and an edge detector, respectively.

Figure 9:
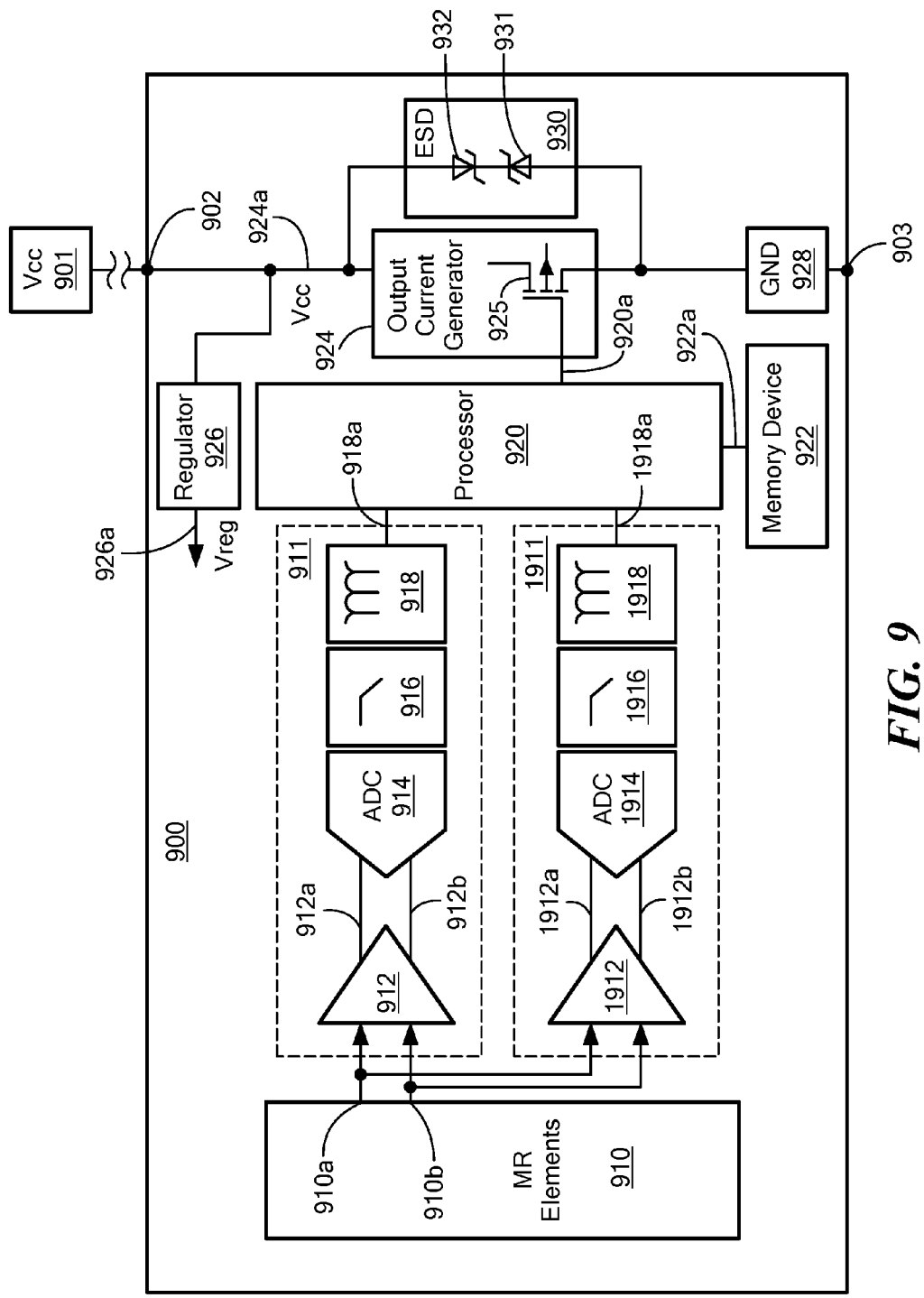
FIG. 9 shows another example magnetic field sensor for detecting motion of an object according to the disclosure.

Referring to FIG. 9, an example magnetic field sensor 900 capable of detecting motion (e.g., speed of motion and/or direction of motion) of an object (e.g., 10, shown in FIG. 1) in accordance with the disclosure includes a plurality of magnetoresistance elements 910, each of which may be the same as or similar to the magnetoresistance elements described above in conjunction with FIGS. 1-8. In some embodiments, the sensor 900 may be provided in the form of an integrated circuit. The sensor 900 also includes respective signal paths, or channels 911 and 1911 (e.g., analog, digital or mixed signal paths). The signal path 911 (i.e., a first example signal path), which may correspond to so-called "right channel circuitry," as discussed above in conjunction with FIGS. 1 and 2, has an input coupled to an output of one or more of the magnetoresistance elements 910 (e.g., two or more for differential sensing arrangements) and an output coupled to a corresponding input of a processor 920. Additionally, the signal path 1911 (i.e., a second example signal path), which may correspond to so-called "left channel circuitry," as discussed above in conjunction with FIGS. 1 and 2, has an input coupled to an output of one or more of the magnetoresistance elements 910 (e.g., two or more for differential sensing arrangements) and an output coupled to a corresponding input of the processor 920.

The magnetoresistance elements 910 (e.g., GMR elements) may be driven by a power supply (Vcc) 901 (or a current source) and configured to generate a respective plurality of magnetic field signals 910a, 910b in response to motion of the object with respect to a magnetic field as may be generated by a magnet (e.g., 110, shown in FIG. 1). The magnetic field signals 910a, 910b may be single-ended signals or differential signals such as signal V1 and signal V2 of FIG. 8. Similar to the magnetoresistance elements described above, the magnetoresistance elements 910 are supported by a semiconductor substrate (not shown) disposed between a magnet and an object to be sensed. In particular, the magnetoresistance elements 910 are disposed along a sensing element axis of the substrate (e.g., 112, shown in FIG. 2) which axis is substantially parallel to a centerline axis of the magnet. The centerline axis of the magnet is substantially parallel to and disposed on a first surface of the magnet which is adjacent to the object such that a line substantially perpendicular to the first surface of the magnet intersects both the centerline axis and the sensing element axis. Additionally, the centerline axis of the magnet and the sensing element axis of the substrate are substantially diagonal with respect to a motion axis substantially parallel to which features of the object pass when the object is in motion.

In a signal path 911 (e.g., right channel circuitry), a first combining circuit 912 (e.g., a summing circuit or a differencing circuit) is coupled to receive the magnetic field signals 910a, 910b (e.g., from first and second sensing elements of sensing element pairs) and configured to generate a first combined signal (here, differential signal 912a, 912b) indicative of a sum of or difference between the magnetic field signals 910a, 910b (e.g., signal V1 and signal V2, shown in FIG. 8). The first combined signal can also be indicative of a position of a feature (e.g., gear tooth 12, shown in FIG. 1) of the object with respect to the magnetoresistance elements 910. For example, the first combined signal can have a maximum (positive or negative) value when a feature of the object is proximate to (e.g., centered about) the magnetoresistance elements. While a differential signal 912a, 912b is shown as the first combined signal, the first combined signal can also be a single-ended signal.

Additionally, in the signal path 911, an analog-to-digital converter (ADC) 914 is coupled to receive the combined signal and configured to generate a corresponding digital signal. A filter 916 (e.g., a digital low pass filter) is coupled to receive the digital signal and configured to generate a filtered signal (e.g., a low pass filtered signal). Further, a filter 918 (e.g., a digital notch filter) is coupled to receive the filtered signal and configured to generate a filtered signal 918a (e.g., a notch filtered signal). The filtered signal 918a (e.g., a right channel signal), which may have edges indicative of motion of the object, is provided to a corresponding input of processor 920.

In a signal path 1911 (e.g., left channel circuitry), a second combining circuit 1912 (e.g., a summing circuit or a differencing circuit) is coupled to receive the magnetic field signals 910a, 910b (e.g., from second and third sensing elements or sensing element pairs) and configured to generate a second combined signal (here, differential signal 1912a, 1912b) indicative of a sum of or difference between the magnetic field signals 910a, 910b. The second combined signal can also be indicative of a position of an edge of a feature (e.g., gear tooth 12, shown in FIG. 1) of the object with respect to the magnetoresistance elements 910. For example, the second combined signal can have a maximum (positive or negative) value when a feature of the object is proximate to (e.g., centered about) the magnetoresistance elements 910. While a differential signal 1912a, 1912b is shown as the second combined signal, the second combined signal can also be a single-ended signal.

In the signal path 1911, an ADC 1914 is also coupled to receive the differential signal 1912a, 1912b and configured to generate a corresponding digital signal. Additionally, a filter 1916 (e.g., a digital low pass filter) is coupled to receive the digital signal and configured to generate a filtered signal (e.g., a low pass filtered signal). Further, a filter 1918 (e.g., a digital notch filter) is coupled to receive the filtered signal and configured to generate a filtered signal 1918a (e.g., a notch filtered signal). The filtered signal 1918a (e.g., a left channel signal), which may also have edges indicative of motion of the object, is provided to a corresponding input of processor 920.

The processor 920 (i.e., processing circuitry) is coupled to receive at least the filtered signal 918a and the filtered signal 1918a at respective inputs and configured to generate a signal 920a at a corresponding output. For example, in the context of a magnetic field sensor that provides a speed indicating output signal, the processor 920 may implement a peak detector that compares the signals 918a, 1918a to one or more threshold signals. It will be appreciated that other processing circuitry can be provided in the processor 920 according to the desired information to be provided in the output signal and/or other signals of sensor 900.

The signal 920a can be provided in a variety of signal formats, including, but not limited to, a SENT form, an $I^2C$ format, a PWM form, or a two-state binary format, and may be provided as a signal indicative of at least one of a speed of motion of an object to which the magnetoresistance elements 910 are proximate and a direction of motion of the object. In one embodiment, the direction of motion of the object can, for example, be determined from a relative phase or relative time difference (e.g., lead or lag) of a particular edge transition in the filtered signal 918 compared with a corresponding edge transition in the filtered signal 1918 (e.g., in a differential sensing arrangement in which a different combination of magnetic field sensing elements contribute to filtered signal 918*a* and filtered signal 1918*a*). Additionally, the rate of edge transitions of one or both of the filtered signal 918 and the filtered signal 1918 may be used to determine the speed of motion of an object.

In some embodiments (e.g., in a so-called "three wire arrangement"), the signal 920*a* may be provided as an output signal of the sensor 900 at a corresponding terminal (e.g., a third terminal, not shown) of the sensor 900. However, in other embodiments, such as the illustrated embodiment (e.g., a so-called "two wire arrangement"), an output signal of the sensor 900 may take the form of a current signal superimposed on the power supply voltage Vcc at the first terminal 902 of the sensor 900. In the example shown, the sensor 900 has only two terminals for a so-called "two wire arrangement," a first terminal 902 (e.g., a signal/power terminal) and a second terminal 903 (e.g., a ground terminal).

In the illustrated two wire arrangement, an output current generator 924, which may include a field effect transistor (FET) 925 as shown, or another transistor (e.g., a bipolar junction (BJT) transistor) in some embodiments, is coupled to receive the signal 920*a* and configured to generate a current output signal between the first terminal 901 and the second terminal 902. Additionally, at substantially the same time, the output current generator 924 may also be coupled to receive a voltage signal from the power supply 901. A resulting signal 924*a* from the output current generator 924 may be both a voltage supply signal and a current signal. It will be apparent how to extract the current signal and the voltage signal from the resulting signal 924*a*.

A voltage regulator 926 can be provided to generate a regulated voltage 926*a* as may be used to power, one or more components in the sensor 900. An electrostatic discharge (ESD) protection circuit 930, which may include one or more Zener diodes (here, Zener diodes 931, 932), for example, may be coupled in parallel with the output current generator 924 to provide ESD protection to the sensor 900.

The sensor 900 can also include a memory device 922 (e.g., EEPROM or flash memory) coupled to the processor 920. The memory device 922 may, for example, be configured to store one or more parameters associated with processing the signals 918*a*, 1918*b*, such as trim values for calibration, and also be configured provide such parameters to the processor 920 (and/or other circuitry internal to or external from the sensor 900) via a signal line 922*a*. The memory device 922 may also be configured to store a state of the parameters (e.g., as may be suitable in the event of power interruption and/or to provide for faster turn on time).

In some embodiments, the output signal of sensor 900 (e.g., signal 920*a* or current signal 924*a*) may be received by circuitry (e.g., analog, digital or mixed-signal circuitry) (not shown) for further processing (e.g., by an engine control unit of ECU).

While the sensor 900 may be provided in the form of an electronic circuit with an analog front end portion and a digital portion, it will be appreciated that the particular delineation of which circuit functions are implemented in an analog fashion or with digital circuitry and signals can be varied. For example, one or more portions of the first signal path 911 (e.g., first combiner circuit 912, ADC 914, filter 916, filter 918) and the second signal path 1911 (e.g., second combiner circuit 1912, ADC 1914, filter 1916, filter 1918) may be provided as part of the processor 920. The processor 920 can, for example, perform the function, operation, or sequence of operations of one or more portions of the first signal path 911 and the second signal path 1911. Additionally, the memory device 922 can be provided as part of the processor 920 (e.g., as onboard EEPROM). Further, some of the illustrated circuit functions can be implemented on separate circuits (e.g., additional substrates within the same integrated circuit package, or additional integrated circuit packages, and/or on circuit boards).

Referring to FIGS. 10-13, example configurations of magnetic field sensors for detecting motion of an object (e.g., 10, shown in FIG. 1) according to the disclosure are shown. Similar to the magnetic field sensors described above (e.g., 400, shown in FIG. 4), the magnets (e.g., 1010, shown in FIG. 10) and the substrates (e.g., 1020, shown in FIG. 10) of the magnetic field sensors described below (e.g., 1000, shown in FIG. 10) may comprise complementary surfaces (e.g., first surfaces 1010*a*, 1020*a*) having same or similar shapes (e.g., a square, rectangle or circular shape) in some embodiments. In other embodiments, the magnets and the substrates may comprise complimentary surfaces having substantially different shapes (e.g., a substantially square shape magnet and a substantially rectangular substrate). For simplicity of discussions in connection with FIGS. 10-13, the former (i.e., a same or similar shape) is shown.

Figure 10:
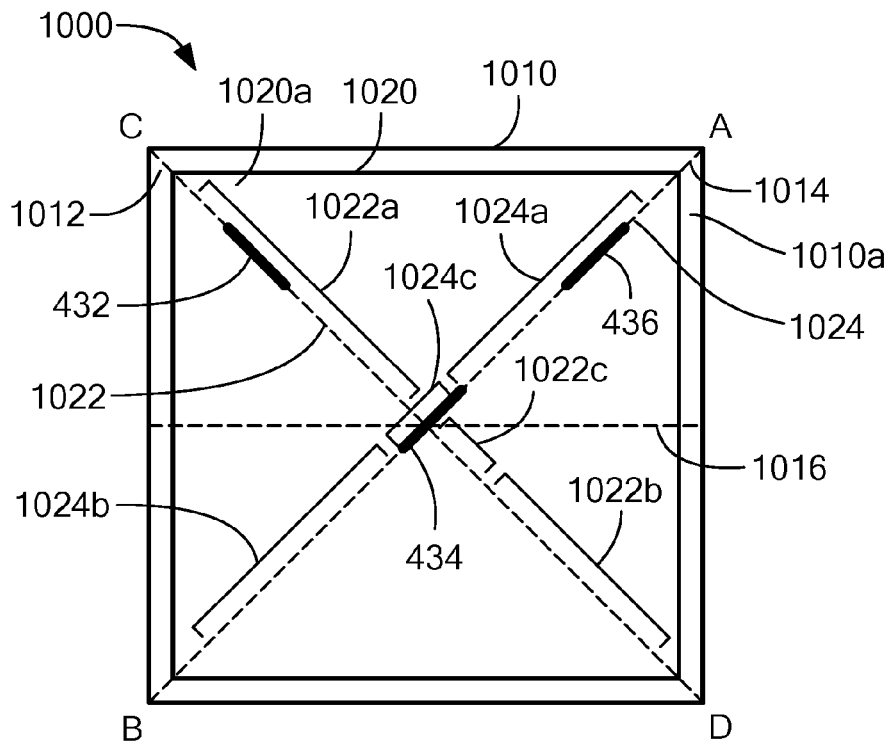
FIG. 10 is a plan view of a first example configuration of a magnetic field sensor according to a further aspect of the disclosure.

Referring to FIG. 10, in which like elements of FIG. 4 are provided having like reference designations, another example magnetic field sensor 1000 is shown to include a magnet 1010, and a substrate 1020 supporting magnetoresistance elements 432, 434, 436. The magnet 1010, which is configured to generate a magnetic field, has a first surface 1010*a* adjacent to the object (not shown) and a second surface (not shown) distal from the object. Additionally, the first surface 1010*a* of the magnet 1010 has a first centerline axis 1012 and a second centerline axis 1014, each of which is substantially parallel to and disposed on the first surface 1010*a*. In the illustrated view, the first centerline axis 1012 is substantially perpendicular to the second centerline axis 1014. The first surface 1010*a* also has a motion axis 1016 which is substantially parallel to and disposed on the first surface 1010*a* and substantially diagonal with respect to both the first centerline axis 1012 and the second centerline axis 1014. Features of the object (e.g., gear teeth 12, 14, 16, shown in FIG. 1) to be sensed by magnetic field sensor 1000 pass substantially parallel to the motion axis 1016 when the object is in motion.

The substrate 1020 is disposed between the magnet 1010 and the object and has a first surface 1020*a* adjacent to the object and a second surface (not shown) distal from the object. The substrate 1020 supports each of the magnetoresistance elements 432, 434, 436, with at least one of the magnetoresistance elements (here, magnetoresistance element 432) disposed along a first sensing element axis 1022 of the substrate 1020 and at least one of the magnetoresistance elements (here, magnetoresistance elements 434, 436) disposed along a second sensing element axis 1024 of the substrate 1020. In the illustrated view, the first sensing element axis 1022 is substantially parallel to the first centerline axis 1012 of the magnet 1010 such that a first line substantially perpendicular to the first surface 1010*a* of the magnet 1010 intersects both the first centerline axis 1012 and the first sensing element axis 1022. Additionally, the second sensing element axis 1024 is substantially parallel to the second centerline axis 1014 of the magnet 1010 such that a second line substantially perpendicular to the first surface 1010*a* of the magnet 1010 intersects both the second centerline axis 1014 and the second sensing element axis 1024.

The magnet 1010 and the substrate 1020 each have a first surface (e.g., 1010a and 1020a) taking the form of a square, and the first centerline axis 1012, the second centerline axis 1014, the first sensing element axis 1022 and the second sensing element axis 1024 each pass substantially proximate to a center (e.g., a substantially geometric center point) of a corresponding surface (e.g., a first surface) of the magnet 1010 and the substrate 1020, respectively. The illustrated first centerline axis 1012 extends from a first vertex A of the first surface 1010a of the magnet 1010 to an opposite vertex B of the first surface 1010a of the magnet 1010. Additionally, the illustrated second centerline axis 1014 extends from a third vertex C of the first surface 1010a of the magnet 1010 to a fourth vertex D of the first surface 1010a of the magnet 1010 that is opposite to the third vertex C, where the third vertex C and the fourth vertex D are both different from the first vertex A and the second vertex B. Magnetoresistance element 432 has a maximum response axis which is substantially orthogonal to the first centerline axis 1012, and magnetoresistance elements 434, 436 each have a maximum response axis which is substantially orthogonal to the second centerline axis 1014.

In one embodiment, both the first centerline axis 1012 and the second centerline axis 1014 are approximately forty-five degrees from the motion axis 1016 at which features of the object pass when the object is in motion. In another embodiment, both the first centerline axis 1012 and the second centerline axis 1014 are between about forty degrees and about fifty degrees from the motion axis 1016. It should be appreciated that other example arrangements of the first centerline axis 1012 and the second centerline axis 1014 with respect to the motion axis 1016 may be possible without degrading performance of the magnetic field sensor 1000.

The magnetoresistance elements 432, 434, 436 are spaced along the first sensing element axis 1022 and the second sensing element axis 1024, and are configured to generate respective magnetic field signals in response to motion of the object with respect to a magnetic field generated by the magnet 1010. Specifically, motion of the object can result in variations of the magnetic field sensed by the magnetoresistance elements 432, 434, 436 and, thus, result in variations of the magnetic field signals generated by the magnetoresistance elements 432, 434, 436.

In the illustrated embodiment, the magnetoresistance elements 432, 434, 436 are substantially equidistantly spaced apart from each other along the first sensing element axis 1022 and the second sensing element axis 1024 in a first example configuration of many potential configurations. In particular, magnetoresistance element 432 is located on a first portion 1022a of the first sensing element axis 1022 proximate to vertex C of the magnet 1010, and magnetoresistance element 436 is located on a first portion 1024a of the second sensing element axis 1024 proximate to a vertex A of the first surface 1010a of the magnet 1010. Additionally, magnetoresistance element 434 is located on a third, center portion 1024c of the second sensing element axis 1024 proximate to a substantially geometric center point of the magnet 1010 (i.e., the point on the first surface 1010a of the magnet 1010 at which magnetic field strength in the direction of polarization is the greatest).

In other example configurations, magnetoresistance element 432 may be located on a second portion 1022b of the first sensing element axis 1022 proximate to a vertex D of the first surface 1010a of the magnet 1010, or on a second portion 1024b of the second sensing element axis 1024 proximate to a vertex B of the first surface 1010a of the magnet 1010. Additionally, magnetoresistance element 436 may be located on the second portion 1024b of the second sensing element axis 1024, or on the second portion 1022b of the first sensing element axis 1024. Further, center magnetoresistance element 434 may be located on a third, center portion 1022c of the first sensing element axis 1022 (described below in connection with FIG. 11) or at various positions on a third sensing element axis (e.g., 1026, described below in connection with FIGS. 11 and 12).

Generally, similar to embodiments described in figured above, the magnetoresistance elements 432, 434, 436 are spaced along the first sensing element axis 1022 and the second sensing element axis 1024 at locations selected to optimize phase separation between the magnetic field signals generated by the magnetoresistance elements 432, 434, 436 without sacrificing signal strength as may be desirable when detecting direction of motion of the object. In other words, the magnetoresistance elements 432, 434, 436 are spaced to have selected responses to a magnetic field generated by the magnet 1010. Additionally, generally the first sensing element axis 1022 and the second sensing element axis 1024 may be arranged with respect to the motion axis 1016 (e.g., not parallel and not orthogonal) to optimize phase separation between the resulting magnetic field signals. Further, in some embodiments, the magnetoresistance elements 432, 434, 436 may also be spaced along the first sensing element axis 1022 and the second sensing element axis 1024 at locations selected to change the magnetic bias on the magnetoresistance elements 432, 434, 436. As noted above, a change in the bias on magnetoresistance elements may result in a change in effective sensitivity and/or an effective saturation point of the magnetoresistance elements.

The magnetic field sensor 1000 can also include circuitry (described above in connection with FIG. 9) responsive to the magnetic field signals generated by the magnetoresistance elements 432, 434, 436 to provide an output signal of the magnetic field sensor 1000. In particular, the circuitry may include right channel circuitry (e.g., a first signal path 911, shown in FIG. 9) coupled to receive magnetic field signals from magnetoresistance element 432 and center magnetoresistance element 434, and left channel circuitry (e.g., a second signal path 1911, shown in FIG. 9) coupled to receive magnetic field signals from magnetoresistance element 436 and center magnetoresistance element 434. The right and left channel circuitry may generate right and left channel signals (e.g., signals 918a, 1918a) having edges indicative of motion of the object.

Since magnetoresistance elements 432, 434 may contribute to the right channel signal and magnetoresistance elements 436, 434 may contribute to the left channel signal in the above described embodiment, and magnetoresistance elements 432, 436 are located at two different positions relative to the object, the right and left channel signals may have transition edges that differ in time (which is equivalent to phase for a particular signal frequency, i.e., particular motion speed). It follows that the phases of the right and left channel signals will be offset from one another and a direction of motion of the object can be determined using the relative phases of the right and left channel signals. Additionally, edge transitions of the right and left channels signals may be used to determine a speed of motion of the object.

With the above-described arrangement, the magnetic field sensor 1000 is capable of detecting motion of an object. In particular, magnetoresistance elements 432, 434, 436 in the magnetic field sensor 1000 each generate respective magnetic field signals in response to motion of the object with respect to a magnetic field generated by the magnet 1010 and the magnetic field signals may be used to detect motion of the object.

Figure 11:
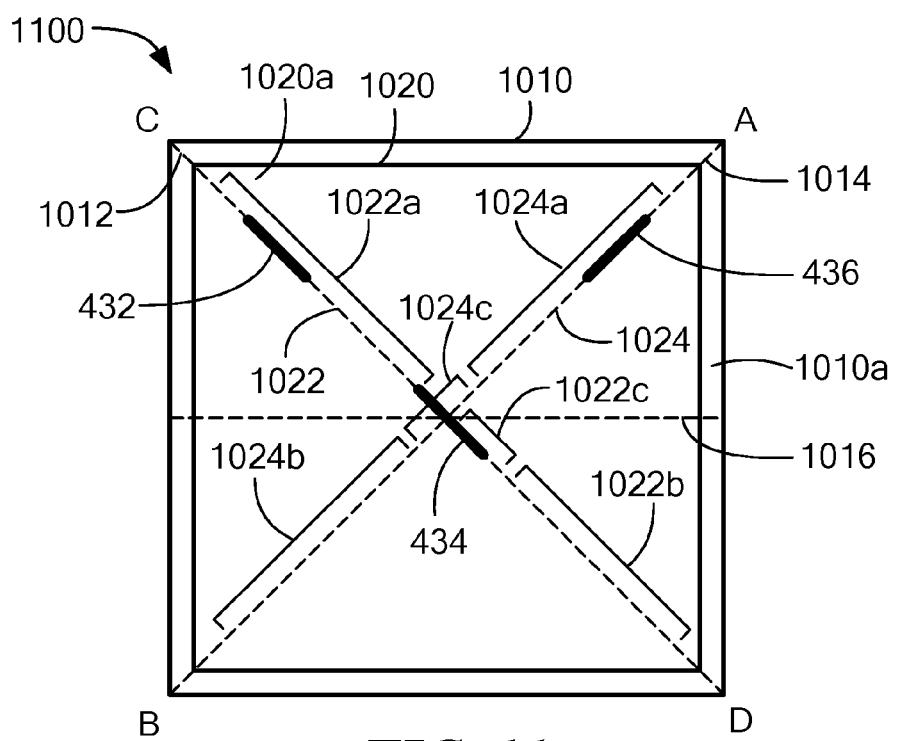
FIG. 11 is a plan view of a second example configuration of a magnetic field sensor according to a further aspect of the disclosure.

Referring to FIG. 11, in which like elements of FIG. 10 are provided having like reference designations, another example magnetic field sensor 1100 according to the disclosure includes a magnet 1010, a substrate 1020 and magnetoresistance elements 432, 434, 436. The substrate 1020 is disposed between the magnet 1010 and an object to be sensed (e.g., 10, shown in FIG. 1) by the magnetic field sensor 1100. Additionally, the substrate 1020 supports the magnetoresistance elements 432, 434, 436.

Similar to magnetic field sensor 1000 of FIG. 10, magnetoresistance element 432 of magnetic field sensor 1100 is disposed on a first portion 1022a of a first sensing element axis 1022 on a first surface 1020a of the substrate 1020. Additionally, magnetoresistance element 436 is disposed on a first portion 1024a of a second sensing element axis 1024 on the first surface 1020a. The first sensing element axis 1022 is substantially parallel to a first centerline axis 1012 on a first surface 1010a of the magnet 1010 and the second sensing element axis 1024 is substantially parallel to a second centerline axis 1014 on the first surface 1010a. Further, the first centerline axis 1012, the second centerline axis 1014, the first sensing element axis 1022, and the second sensing element axis 1024 are each substantially diagonal with respect to a motion axis 1016 which is substantially parallel to and disposed on the first surface 1010a of the magnet 1010.

Here, however, unlike magnetic field sensor 1000, center magnetoresistance element 434 in sensor 1100 is located on a third, center portion 1022c of the first sensing element axis 1022 which is proximate to a center point on the first surface 1010a of the magnet 1010. In one embodiment, despite the magnetoresistance element 434 of sensor 1100 being located on a different sensing element axis than the magnetoresistance element of sensor 1000, the sensor 1100 has a similar response characteristic as sensor 1000, with output signals of the sensor 1000, 1100 being substantially the same but with different phases (e.g., due to the magnetic field being detected at two different positions relative to the object.

For example, in embodiments in which right channel circuitry is coupled to receive magnetic field signals from magnetoresistance element 432 and center magnetoresistance element 434, and left channel circuitry is coupled to receive magnetic field signals from magnetoresistance element 436 and center magnetoresistance element 434, the right and left channel signals generated by sensor 1100 may have transition edges that differ in time in comparison to the right and left channel signals generated by sensor 1000. In other words, the phases of the right and left channel signals generated by sensor 1100 will be offset with respect to the right and left channel signals generated by sensor 1000 based on detection of the magnetic field at two different positions relative to the object. However, a direction of motion of the object can still be determined using the relative phases of the right and left channel signals generated by the sensor 1100. Additionally, edge transitions of the right and left channels signals generated by the sensor 1100 may still be used to determine a speed of motion of the object.

Figure 12:
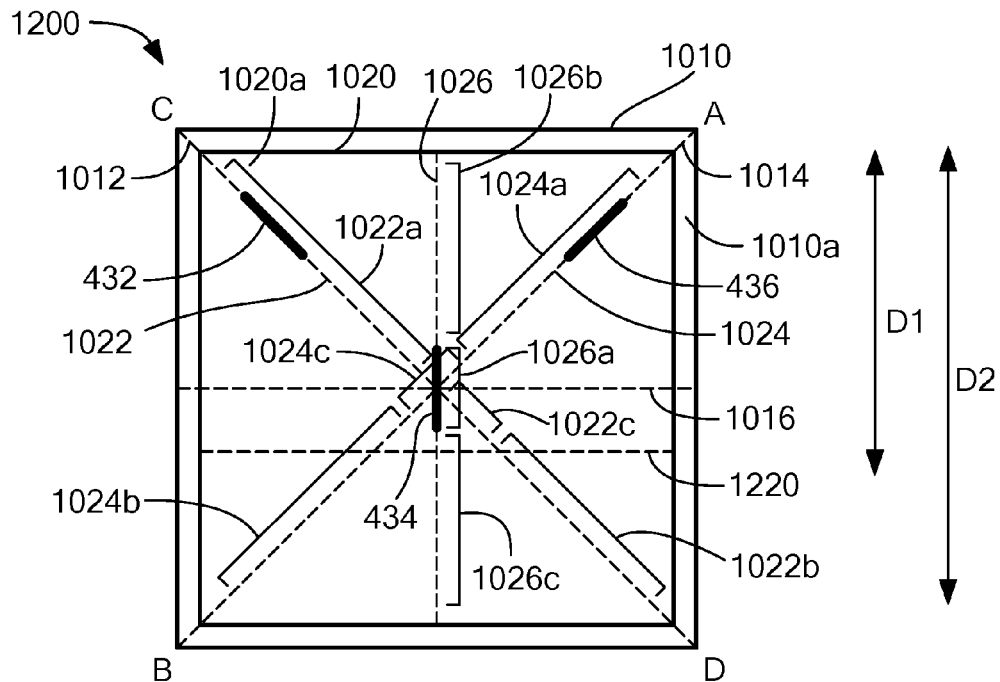
FIG. 12 is a plan view of a third example configuration of a magnetic field sensor according to a further aspect of the disclosure.

Referring to FIG. 12, another example magnetic field sensor 1200 is shown to include magnet 1010, substrate 1020 and magnetoresistance elements 432, 434, 436. The substrate 1020 is disposed between the magnet 1010 and an object to be sensed (e.g., 10, shown in FIG. 1), and the substrate 1020 supports the magnetoresistance elements 432, 434, 436. Similar to magnetic field sensor 1100 of FIG. 11, magnetoresistance element 432 of magnetic field sensor 1200 is disposed on a first portion 1022a of a first sensing element axis 1022 on a first surface 1020a of the substrate 1020, with the first sensing element axis 1022 being substantially parallel to a first centerline axis 1012 of the magnet 1010. Additionally, magnetoresistance element 436 is disposed on a first portion 1024a of a second sensing element axis 1024 on the first surface 1020a of the substrate 1020, with the second sensing element axis 1024 being substantially parallel to a second centerline axis 1014 of the magnet 1010. Further, the first centerline axis 1012, the second centerline axis 1014, the first sensing element axis 1022, and the second sensing element axis 1024 are each substantially diagonal with respect to a motion axis 1016 which is substantially parallel to and disposed on the first surface 1010a of the magnet 1010.

In the illustrated embodiment, the substrate 1020 also includes a third sensing element axis 1026 on which center magnetoresistance element 434 is disposed at a first, center portion 1026a. The third sensing element axis 1026, similar to the first sensing element axis 1022 and the second sensing element axis 1024, is disposed on the first surface 1020a of the substrate 1020. In one embodiment, the third sensing element axis 1026 is approximately forty-five degrees from both the first sensing element axis 1022 and the second sensing element axis 1024. In another embodiment, the third sensing element axis 1026 is between about forty degrees and about fifty degrees from both the first sensing element axis 1022 and the second sensing element axis 1024. For example, the third sensing element axis 1026 may be approximately forty-two degrees from the first sensing element axis 1022 and approximately forty-eight degrees from the second sensing element axis 1024. The magnetoresistance elements 432, 434, 436 disposed on the first sensing element axis 1022, the second sensing element axis 1024, and the third sensing element axis 1026 are configured to generate respective magnetic field signals in response to motion of the object with respect to a magnetic field generated by the magnet 1010.

Similar to sensor 1000 of FIG. 10 and sensor 1100 of FIG. 11, sensor 1200 can include right channel circuitry coupled to receive magnetic field signals from magnetoresistance element 432 and center magnetoresistance element 434, and left channel circuitry coupled to receive magnetic field signals from magnetoresistance element 436 and center magnetoresistance element 434. The right and left channel circuitry may generate right and left channel signals having edges indicative of motion of the object. Since the magnetoresistance elements 432, 434 may contribute to the right channel signal and magnetoresistance elements 436, 434 may contribute to the left channel signal in the above described embodiment, and magnetoresistance element 434 of sensor 1200 is located at a different position relative to the object than magnetoresistance element 434 of sensor 1000, the right and left channel signals generated by sensor 1200 may have transition edges that differ in time in comparison to the right and left channel signals generated by sensor 1000. Additionally, since magnetoresistance element 434 of sensor 1200 is located at a different position relative to the object than magnetoresistance element 434 of sensor 1100, the right and left channel signals generated by sensor 1200 may have transition edges that differ in time in comparison to the right and left channel signals generated by sensor 1100.

It follows that the phases of the right and left channel signals generated by sensor 1200 will be offset with respect to the right and left channel signals generated by sensor 1000 and offset with respect to the right and left channel signals generated by sensor 1100. However, a direction of motion of the object can still be determined using the relative phases of the right and left channel signals generated by the sensor 1200. Additionally, edge transitions of the right and left channels signals generated by the sensor 1200 may still be used to determine a speed of motion of the object.

In some embodiments, with the above-described arrangements of FIGS. 10-12 in which the magnetoresistance elements 432, 434, 436 of the magnetic field sensors are arranged along two or more sensing elements axes (e.g., 1022 and 1024), the substrate 1020 may take the form of a substrate 1220 shown in FIG. 12, the substrate 1220 having at least one reduced dimension (e.g., D2 to D1) in comparison to the substrate 1020 shown. The substrate 1220 may also have at least one reduced dimension in comparison to arrangements in which the magnetoresistance elements are arranged along a single sensing element axis (e.g., 1022 or 1024). Such may, for example, reduce costs associated with manufacturing the substrate on which the magnetoresistance elements are disposed, and thereby reduce costs associated with manufacturing the magnetic field sensor. A substrate having reduced dimensions (or reduced spacing requirements) may also provide for offset cancellation and/or allow for mounting of magnetic field sensors including the substrate from substantially zero degrees (a so-called "face read") with respect to a target (e.g., object 10, shown in FIG. 1) to be sensed by the sensors to substantially ninety degrees (a so-called "perpendicular read") with respect to the target in some embodiments.

Figure 13:
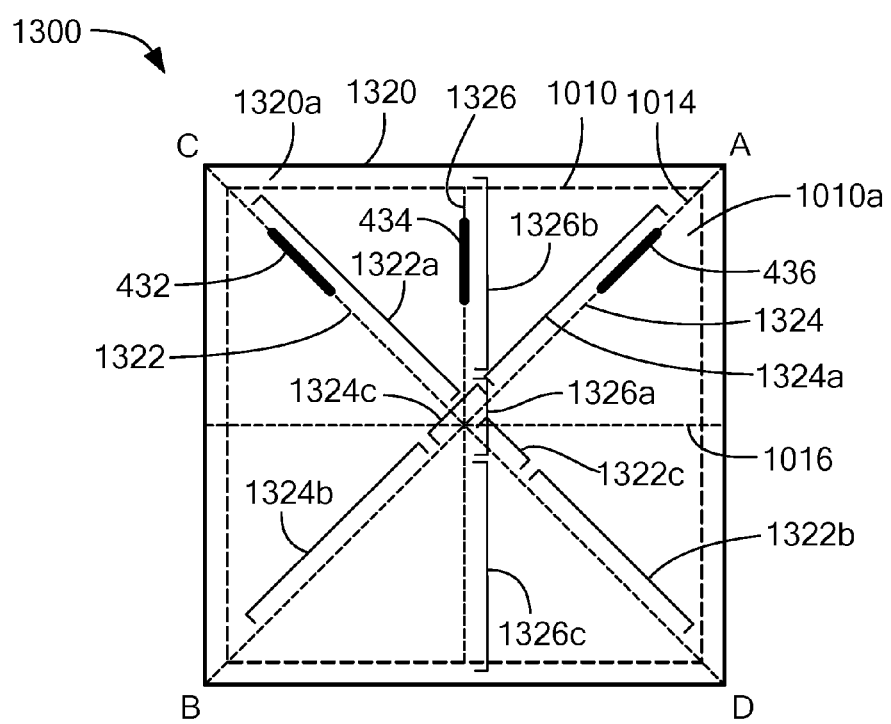
FIG. 13 is a plan view of a fourth example configuration of a magnetic field sensor according to a further aspect of the disclosure.

Referring to FIG. 13, in which like elements of FIG. 12 are provided having like reference designations, another example magnetic field sensor 1300 is shown to include magnet 1010, a substrate 1320 and magnetoresistance elements 432, 434, 436. The substrate 1320, which has dimensions larger than the magnet 1010 in the illustrated embodiment, is disposed between the magnet 1010 and an object to be sensed (e.g., 10, shown in FIG. 1). Additionally, the substrate 1320 supports the magnetoresistance elements 432, 434, 436.

Similar to magnetic field sensor 1200 of FIG. 12, magnetoresistance element 432 of magnetic field sensor 1200 is disposed on a first portion 1322*a* of a first sensing element axis 1322 on a first surface 1320*a* of the substrate 1320. Additionally, magnetoresistance element 436 is disposed on a first portion 1324*a* of a second sensing element axis 1324 on the first surface 1320*a*. The first sensing element axis 1322 is substantially parallel to a first centerline axis 1012 on a first surface 1010*a* of the magnet 1010 and the second sensing element axis 1324 is substantially parallel to a second centerline axis 1014 on the first surface 1010*a*. Further, the first centerline axis 1012, the second centerline axis 1014, the first sensing element axis 1322, and the second sensing element axis 1324 are each substantially diagonal with respect to a motion axis 1016 which is substantially parallel to and disposed on the first surface 1010*a* of the magnet 1010.

Here, however, unlike magnetic field sensor 1200, center magnetoresistance element 434 in sensor 1300 is disposed on a second portion 1326*b* of a third sensing element axis 1326 which is proximate to a corner on the first surface 1010*a* of the magnet 1010. It follows that in embodiments in which right channel circuitry is coupled to receive magnetic field signals from magnetoresistance element 432 and center magnetoresistance element 434, and left channel circuitry is coupled to receive magnetic field signals from magnetoresistance element 436 and center magnetoresistance element 434, the right and left channel signals generated by sensor 1300 may have transition edges that differ in time in comparison to the right and left channel signals generated by sensor 1200. In other words, the phases of the right and left channel signals generated by sensor 1300 will be offset with respect to the right and left channel signals generated by sensor 1200 based on detection of the magnetic field at two different positions relative to the object. However, a direction of motion of the object can still be determined using the relative phases of the right and left channel signals generated by the sensor 1300. Additionally, edge transitions of the right and left channels signals generated by the sensor 1300 may still be used to determine a speed of motion of the object.

While magnetoresistance element 434 is shown as disposed on first portion 1026*a* of the third sensing element axis 1026 in FIG. 12 and as disposed on second portion 1326*b* of the third sensing element axis 1326 in FIG. 13, it should be appreciated that the magnetoresistance element 434 may also be disposed on a third portions 1026*c*, 1326*c* of the third sensing element axes 1026, 1326 of FIGS. 12 and 13, respectively, which are proximate to another corner of the first surface 1010*a* of the magnet 1010.

Additionally, while three magnetoresistance elements 432, 434, 436 are shown in FIGS. 10-13, it should be appreciated that three or more magnetoresistance elements can be used. For example, in an embodiment using four magnetoresistance elements, a first magnetoresistance element can be disposed on a first sensing element axis (e.g., 1022), a second sensing element can be disposed on a second sensing element axis (e.g., 1024), and third and fourth sensing elements can be disposed on a third sensing element axis (e.g., 1026). Further, it should be appreciated that the magnetic field sensors described above are but several of many potential configurations of magnetic field sensors according to the disclosure.

As described above and will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular sensing arrangements (e.g., differential sensing arrangements) but rather, may be useful in substantially any sensing arrangement where it is desired to detect motion of an object.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above. Accordingly, it is submitted that that scope of the patent should not be limited to the described embodiments but rather should be limited only by the spirit and scope of the following claims.

What is claimed is:

1. A magnetic field sensor for detecting motion of an object, comprising:
a magnet configured to generate a magnetic field and having a first surface adjacent to the object and a second surface distal from the object, wherein the first surface has a centerline axis substantially parallel to and disposed on the first surface, wherein the centerline axis is substantially diagonal with respect to a motion axis substantially parallel to and disposed on the first surface, wherein features of the object pass parallel to the motion axis when the object is in motion; and
a semiconductor substrate disposed between the magnet and the object, the semiconductor substrate supporting a plurality of spaced magnetoresistance elements disposed along a sensing element axis substantially parallel to the centerline axis of the magnet and configured to generate a respective plurality of magnetic field signals in response to the motion of the object with respect to the magnetic field, wherein a line substantially perpendicular to the first surface of the magnet intersects both the centerline axis and the sensing element axis, and wherein each of the plurality of magnetoresistance elements has a maximum response axis orthogonal to the centerline axis.

2. The magnetic field sensor of claim 1, wherein the first surface of the magnet forms a square and the centerline axis extends from a first vertex of the first surface of the magnet to an opposite vertex of the first surface of the magnet.

3. The magnetic field sensor of claim 2, wherein the centerline axis is approximately forty-five degrees from the motion axis.

4. The magnetic field sensor of claim 1, wherein the first surface of the magnet forms a circle.

5. The magnetic field sensor of claim 4, wherein the centerline axis passes proximate to a center of the magnet.

6. The magnetic field sensor of claim 1, wherein a center magnetoresistance element of the plurality of magnetoresistance elements is disposed closer to a center of the magnet than other ones of the plurality of magnetoresistance elements.

7. The magnetic field sensor of claim 1, wherein the plurality of magnetoresistance elements are substantially equidistantly spaced apart from each other along the sensing element axis.

8. The magnetic field sensor of claim 7, wherein the plurality of magnetoresistance elements are spaced along the sensing element axis at locations selected to maximize phase separation of the magnetic field signals.

9. The magnetic field sensor of claim 1, wherein the plurality of magnetoresistance elements are coupled in a bridge configuration.

10. The magnetic field sensor of claim 1, wherein the plurality of magnetoresistance elements comprise one or more of an anisotropic magnetoresistance (AMR) element, a giant magnetoresistance (GMR) element, a magnetic tunnel junction (MTJ) element and a tunneling magnetoresistance (TMR) element.

11. The magnetic field sensor of claim 1, wherein each of the plurality of magnetoresistance elements has a substantially similar resistance when the magnetic field has a magnetic field strength of about zero Gauss.

12. The magnetic field sensor of claim 1, wherein the magnet has a shape corresponding to one of a cube, a cylinder, a rectangular prism or a pyramid.

13. The magnetic field sensor of claim 1, wherein the first surface of the magnet corresponds to a north pole of the magnet and the second surface of the magnet corresponds to a south pole of the magnet.

14. The magnetic field sensor of claim 1, wherein the first surface of the magnet corresponds to a south pole of the magnet and the second surface of the magnet corresponds to a north pole of the magnet.

15. The magnetic field sensor of claim 1, further comprising circuitry responsive to the plurality of magnetic field signals to provide an output signal of the magnetic field sensor indicative of the motion of the object.

16. The magnetic field sensor of claim 15, wherein the output signal of the magnetic field sensor is indicative of one or more of a speed of motion of the object and a direction of motion of the object.

17. The magnetic field sensor of claim 1, wherein the plurality of magnetoresistance elements comprises three pairs of magnetoresistance elements coupled in a bridge configuration to generate a first differential voltage signal corresponding to a difference between voltages across a first pair and a second pair of the magnetoresistance elements and to generate a second differential voltage signal corresponding to a difference between voltages across the second pair and a third pair of the magnetoresistance elements.

18. A magnetic field sensor for detecting motion of an object, comprising:
a magnet configured to generate a magnetic field and having a first surface adjacent to the object and a second surface distal from the object, wherein the first surface has a first centerline axis and a second centerline axis which are substantially parallel to and disposed on the first surface, wherein the first centerline axis and the second centerline axis are each substantially diagonal with respect to a motion axis substantially parallel to and disposed on the first surface, wherein features of the object pass parallel to the motion axis when the object is in motion and the first centerline axis is substantially perpendicular to the second centerline axis; and
a semiconductor substrate disposed between the magnet and the object, the semiconductor substrate supporting a plurality of spaced magnetoresistance elements disposed along at least one of a first sensing element axis substantially parallel to the first centerline axis of the magnet and a second sensing element axis substantially parallel to the second centerline axis, and configured to generate a respective plurality of magnetic field signals in response to the motion of the object with respect to the magnetic field, wherein a first line substantially perpendicular to the first surface of the magnet intersects both the first centerline axis and the first sensing element axis, and a second line substantially perpendicular to the first surface of the magnet intersects both the second centerline axis and the second sensing element axis, wherein at least one of the plurality of magnetoresistance elements is disposed along the first sensing element axis and at least one of the plurality of magnetoresistance elements is disposed along the second sensing element axis, wherein each of the plurality of magnetoresistance elements has a maximum response axis orthogonal to at least one of the first the centerline axis and the second centerline axis.

19. The magnetic field sensor of claim 18, wherein the plurality of magnetoresistance elements are substantially equidistantly spaced apart from each other along the first sensing element axis and the second sensing element axis.

20. The magnetic field sensor of claim 18, wherein the first surface of the magnet forms a square and the first centerline axis extends from a first vertex of the first surface of the magnet to a second vertex of the first surface of the magnet that is opposite to the first vertex, and the second centerline axis extends from a third vertex of the first surface of the magnet to a fourth vertex of the first surface of the magnet that is opposite to the third vertex, wherein the third vertex and the fourth vertex are both different from the first vertex and the second vertex.

21. The magnetic field sensor of claim 20, wherein both the first centerline axis and the second centerline axis are approximately forty-five degrees from the motion axis.

22. The magnetic field sensor of claim 18, further comprising at least one magnetoresistance element disposed along a third sensing element axis that is approximately forty-five degrees from both the first sensing element axis and the second sensing element axis.

23. The magnetic field sensor of claim 18, wherein the first surface of the magnet forms a circle.

24. The magnetic field sensor of claim 18, wherein the plurality of magnetoresistance elements comprise one or more of an anisotropic magnetoresistance (AMR) element, a giant magnetoresistance (GMR) element, a magnetic tunnel junction (MTJ) element and a tunneling magnetoresistance (TMR) element.

25. The magnetic field sensor of claim 18, wherein a center magnetoresistance element of the plurality of magnetoresistance elements is disposed closer to a center of the magnet than other ones of the plurality of magnetoresistance elements.

* * * * *

UNITED STATES PATENT AND TRADEMARK OFFICE
CERTIFICATE OF CORRECTION

PATENT NO. : 9,880,026 B1
APPLICATION NO. : 15/210211
DATED : January 30, 2018
INVENTOR(S) : Jeffrey Eagen et al.

It is certified that error appears in the above-identified patent and that said Letters Patent is hereby corrected as shown below:

Column 24, Line 10 delete "figured" and replace with --figures--.

Column 25, Line 41 delete "object." and replace with --object).--.

Signed and Sealed this
Third Day of July, 2018

Andrei Iancu
*Director of the United States Patent and Trademark Office*